United States Patent
Sizov et al.

(10) Patent No.: US 11,967,586 B2
(45) Date of Patent: Apr. 23, 2024

(54) MICRO LED BASED DISPLAY PANEL

(71) Applicant: Apple Inc., Cupertino, CA (US)

(72) Inventors: Dmitry S. Sizov, Cupertino, CA (US); Ion Bita, Santa Clara, CA (US); Jean-Jacques P. Drolet, Bavaria (DE); John T. Leonard, San Jose, CA (US); Jonathan S. Steckel, Cupertinov, CA (US); Nathaniel T. Lawrence, San Francisco, CA (US); Xiaobin Xin, Sunnyvale, CA (US); Ranojoy Bose, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/809,785

(22) Filed: Jun. 29, 2022

(65) Prior Publication Data

US 2023/0018406 A1    Jan. 19, 2023

Related U.S. Application Data

(63) Continuation of application No. 16/960,480, filed as application No. PCT/US2019/014595 on Jan. 22, 2019, now Pat. No. 11,404,400.
(Continued)

(51) Int. Cl.
*H01L 25/075*    (2006.01)
*H01L 23/00*    (2006.01)
(Continued)

(52) U.S. Cl.
CPC .......... *H01L 25/0753* (2013.01); *H01L 24/08* (2013.01); *H01L 24/32* (2013.01);
(Continued)

(58) Field of Classification Search
None
See application file for complete search history.

(56) References Cited

U.S. PATENT DOCUMENTS 9,484,504 B2   11/2016   Bibl et al.
9,620,487 B2 *  4/2017   Sakariya ............. H01L 25/0753
(Continued)

FOREIGN PATENT DOCUMENTS

CN    101577303 A    11/2009
CN    102074637 A     5/2011
(Continued)

OTHER PUBLICATIONS

PCT International Search Report and Written Opinion for International Application No. PCT/US2016/041005, dated Jan. 2, 2017, 18 pages.
(Continued)

*Primary Examiner* — Robert K Carpenter
(74) *Attorney, Agent, or Firm* — Aikin & Gallant, LLP

(57) ABSTRACT

Light emitting structures and methods of fabrication are described. In an embodiment, LED coupons are transferred to a carrier substrate and then patterned to LED mesa structures. Patterning may be performed on heterogeneous groups of LED coupons with a common mask set. The LED mesa structure are then transferred in bulk to a display substrate. In an embodiment, a light emitting structure includes an arrangement of LEDs with different thickness, and corresponding bottom contacts with different thicknesses bonded to a display substrate.

17 Claims, 18 Drawing Sheets

Related U.S. Application Data

(60) Provisional application No. 62/621,367, filed on Jan. 24, 2018.

(51) Int. Cl.
  | | |
  |---|---|
  | *H01L 25/16* | (2023.01) |
  | *H01L 25/18* | (2023.01) |
  | *H01L 33/60* | (2010.01) |
  | *H01L 33/00* | (2010.01) |
  | *H01L 33/38* | (2010.01) |

(52) U.S. Cl.
  CPC ............ *H01L 24/73* (2013.01); *H01L 25/167* (2013.01); *H01L 25/18* (2013.01); *H01L 33/60* (2013.01); *H01L 33/0008* (2013.01); *H01L 33/0093* (2020.05); *H01L 33/38* (2013.01); *H01L 2224/08225* (2013.01); *H01L 2224/32225* (2013.01)

(56) References Cited

U.S. PATENT DOCUMENTS

| | | |
|---|---|---|
| 9,728,687 B2 | 8/2017 | Stott et al. |
| 10,043,784 B2 | 8/2018 | Sakariya et al. |
| 10,297,581 B2 | 5/2019 | Steckel et al. |
| 10,685,940 B2 | 6/2020 | Steckel et al. |
| 11,404,400 B2 | 8/2022 | Sizov et al. |
| 2005/0221519 A1 | 10/2005 | Leung et al. |
| 2006/0145137 A1 | 7/2006 | Wang et al. |
| 2008/0296589 A1* | 12/2008 | Speier ............... H01L 33/642 257/E33.001 |
| 2009/0278151 A1 | 11/2009 | Kim |
| 2010/0019260 A1 | 1/2010 | Epler et al. |
| 2010/0084629 A1 | 4/2010 | Park et al. |
| 2010/0123155 A1 | 5/2010 | Pickett et al. |
| 2010/0163898 A1 | 7/2010 | Hung et al. |
| 2010/0207135 A1 | 8/2010 | Aketa et al. |
| 2011/0284822 A1 | 11/2011 | Jung et al. |
| 2012/0217519 A1 | 8/2012 | Xu et al. |
| 2013/0026511 A1 | 1/2013 | Yeh et al. |
| 2013/0070480 A1 | 3/2013 | Griffin et al. |
| 2013/0087821 A1 | 4/2013 | Do et al. |
| 2013/0146841 A1 | 6/2013 | Yun et al. |
| 2013/0334559 A1 | 12/2013 | Vdovin et al. |
| 2014/0133177 A1 | 5/2014 | Miller et al. |
| 2014/0159043 A1 | 6/2014 | Sakariya et al. |
| 2014/0264412 A1 | 9/2014 | Yoon et al. |
| 2014/0319553 A1 | 10/2014 | Ye et al. |
| 2014/0339495 A1 | 11/2014 | Bibl et al. |
| 2014/0367633 A1 | 12/2014 | Bibl et al. |
| 2015/0111329 A1 | 4/2015 | Wu et al. |
| 2015/0169011 A1 | 6/2015 | Bibl et al. |
| 2015/0187987 A1 | 7/2015 | Sim et al. |
| 2015/0187991 A1 | 7/2015 | McGroddy et al. |
| 2015/0219936 A1 | 8/2015 | Kim et al. |
| 2015/0221835 A1 | 8/2015 | Tischler et al. |
| 2015/0362165 A1 | 12/2015 | Chu et al. |
| 2015/0380459 A1* | 12/2015 | Bono ............... H01L 27/15 257/14 |
| 2016/0013167 A1 | 1/2016 | Sakariya et al. |
| 2016/0018065 A1 | 1/2016 | Schinagl |
| 2016/0197232 A1 | 7/2016 | Bour et al. |
| 2016/0276329 A1 | 9/2016 | Bono et al. |
| 2017/0018538 A1 | 1/2017 | Tiwari et al. |
| 2017/0025589 A1 | 1/2017 | Chang et al. |
| 2017/0045201 A1 | 2/2017 | Jones |
| 2017/0062674 A1 | 3/2017 | Kwon et al. |
| 2017/0092626 A1 | 3/2017 | Yuan et al. |
| 2017/0133357 A1 | 5/2017 | Kuo et al. |
| 2017/0162553 A1 | 6/2017 | Bibl et al. |
| 2017/0294416 A1 | 10/2017 | Wu et al. |
| 2017/0294565 A1 | 10/2017 | Kim |
| 2017/0301660 A1 | 10/2017 | Pokhriyal et al. |
| 2017/0309798 A1 | 10/2017 | Bonar et al. |
| 2017/0338276 A1* | 11/2017 | Nayak ............... H01L 33/24 |
| 2018/0163932 A1 | 6/2018 | Schinagl |
| 2018/0166424 A1* | 6/2018 | Sim ............... H01L 33/44 |
| 2018/0190625 A1 | 7/2018 | Steckel et al. |
| 2018/0287018 A1 | 10/2018 | Goldbach et al. |
| 2019/0237444 A1 | 8/2019 | Steckel et al. |
| 2020/0343230 A1 | 10/2020 | Sizov et al. |

FOREIGN PATENT DOCUMENTS

| | | |
|---|---|---|
| CN | 102903804 A | 1/2013 |
| CN | 104838508 A | 8/2015 |
| CN | 105144387 A | 12/2015 |
| CN | 106558577 A | 4/2017 |
| EP | 2395569 A2 | 12/2011 |
| EP | 2973715 A1 | 1/2016 |
| EP | 3168884 A1 | 5/2017 |
| WO | 2011129538 A2 | 10/2011 |
| WO | 2016/196390 A1 | 12/2016 |
| WO | 2016/200635 A1 | 12/2016 |
| WO | 2017007770 A2 | 1/2017 |
| WO | 2017214122 A1 | 12/2017 |
| WO | 2019147589 A1 | 8/2019 |

OTHER PUBLICATIONS

PCT International Search Report and Written Opinion for International Application No. PCT/US2019/014595, dated Apr. 29, 2019, 13 pages.

* cited by examiner

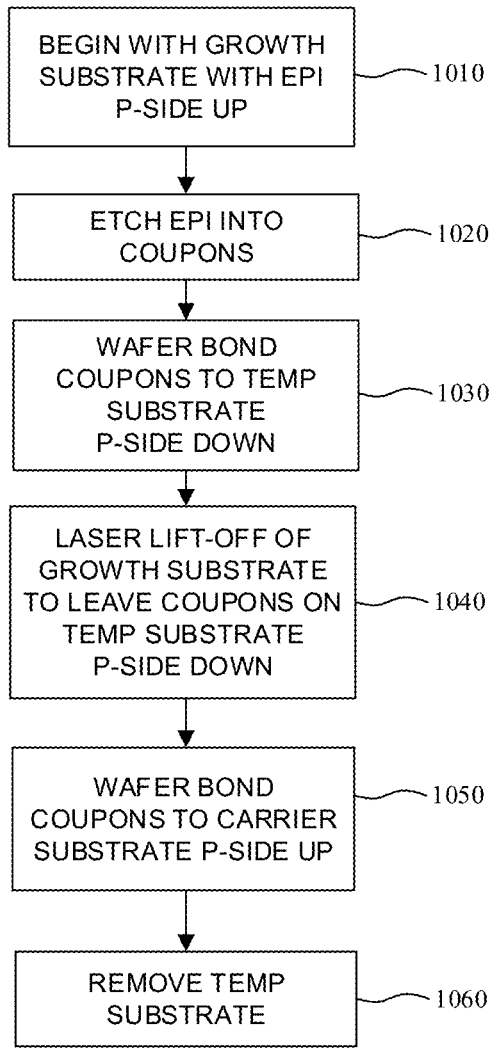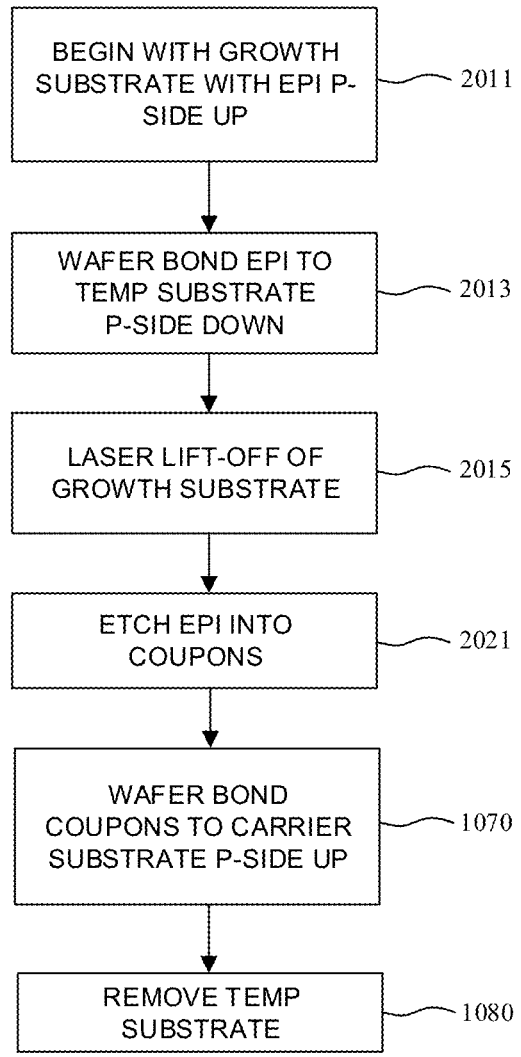
FIG. 2C
FIG. 2D

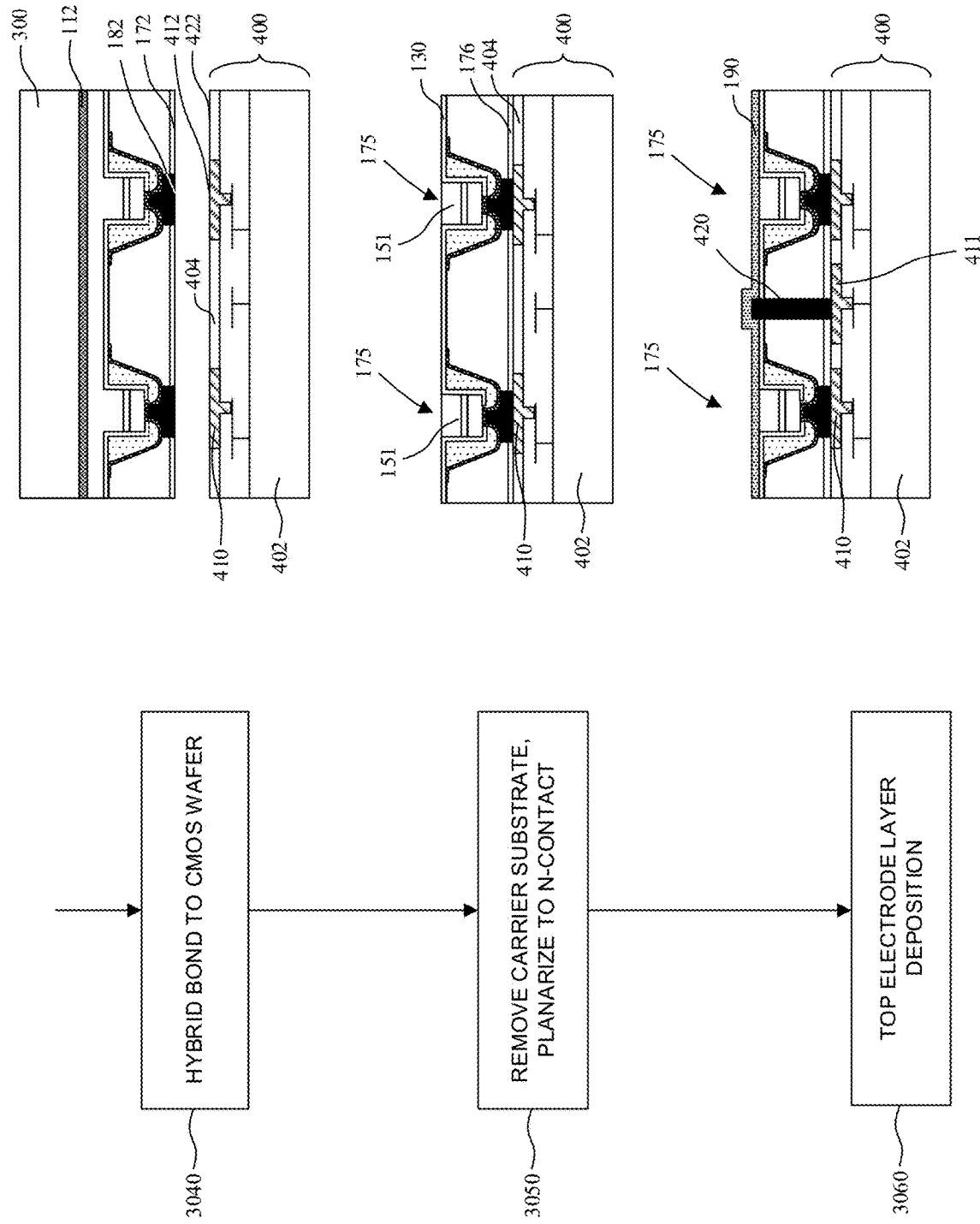

MICRO LED BASED DISPLAY PANEL

RELATED APPLICATIONS

This application is a continuation of co-pending U.S. patent application Ser. No. 16/960,480, filed Jul. 7, 2020, which is a U.S. National Phase Application under 35 U.S.C. § 371 of International Application No. PCT/US2019/014595, filed Jan. 22, 2019, entitled MICRO LED BASED DISPLAY PANEL, which claims priority to U.S. Provisional Patent Application No. 62/621,367, filed on Jan. 24, 2018. Both International Application No. PCT/US2019/014595 and U.S. Provisional Patent Application No. 62/621,367 are incorporated herein by reference.

BACKGROUND

Field

Embodiments described herein relate to light emitting structures. More specifically, embodiments relate to micro light emitting diode (LED) based display panels.

Background Information

State of the art displays for portable electronics, computers, and televisions commonly utilize glass substrates with thin film transistors (TFTs) to control transmission of backlight through pixels based on liquid crystals. More recently emissive displays such as those based on organic light emitting diodes (OLEDs) have been introduced. Even more recently, it has been proposed to integrate emissive inorganic semiconductor-based micro LEDs into displays. More specifically, it has been proposed to transfer individual micro LEDs from carrier substrates to a display substrate utilizing an array of electrostatic transfer heads.

SUMMARY

Embodiments describe light emitting structures and methods of forming light emitting structures. In an embodiment, a method of forming a light emitting structure includes forming one or more pluralities of LED coupons on one or more corresponding temporary substrates, transferring the one or more pluralities of LED coupons to a carrier substrate, patterning the one or more pluralities of LED coupons into LED mesa structures, and transferring the LED mesa structures to a display substrate. In some embodiments, well structures may also be formed around the LED mesa structures prior to transferring to the display substrate. Additionally, hybrid bonding may be utilized for bonding to the display substrate. The processing sequences in accordance with embodiments may be used to form both monochromatic and full color displays.

In an embodiment, a light emitting structure includes an LED bonded to an electrode pad of a substrate, such as a complementary metal-oxide-semiconductor (CMOS) substrate. The LED may include an inorganic semiconductor-based p-n diode, and a metallic bottom contact bonded to the electrode pad. An insulating fill layer may additionally be located laterally around the LED and the metallic bottom contact. In an embodiment, a planar bottom surface of the metallic bottom contact is bonded to a planar top surface of the electrode pad with a metal-metal bond, and a planar bottom surface of the insulating fill layer is bonded to a planar top surface of the substrate with an oxide-oxide bond. Additionally, the LED may be mounted within a well structure embedded within the insulating fill layer.

In an embodiment, a light emitting structure includes a first inorganic semiconductor-based p-n diode designed to emit a first color emission, and a first metallic bottom contact bonded to a first electrode pad. The light emitting structure may additionally include a second LED (as well as more) including a second inorganic semiconductor-based p-n diode designed to emit a second color emission different from the first color emission, and a second metallic bottom contact bonded to a second electrode pad. In some embodiments, the first metallic bottom contact is thicker than the second metallic bottom contact, and the second inorganic semiconductor-based p-n diode is thicker than the first inorganic semiconductor-based p-n diode. In some embodiments, the bottom surfaces of the first and second metallic bottom contacts are co-planar. In addition, the first metallic bottom contact may be thicker than the second metallic bottom contact by a first thickness, and the second inorganic semiconductor-based p-n diode may be thicker than the first inorganic semiconductor-based p-n diode by approximately the first thickness. Additionally, the LEDs may be mounted within corresponding well structures embedded within the insulating fill layer.

In accordance with some embodiments, the processing sequence may facilitate the integration scaling of the LEDs to small micro dimensions, and integration of optical structures around and over the LEDs with mitigated alignment challenges. Additionally, the integration of reflective well structures, and micro-optic elements may additionally bolster on-axis light extraction efficiency.

BRIEF DESCRIPTION OF THE DRAWINGS

FIGS. 2C-2D are process flows of methods of forming monochromatic color emitting LED coupons on a carrier substrate in accordance with embodiments.

FIG. 3B includes a process flow and corresponding cross-sectional side view illustrations of a method of integrating a pair of LED mesa structures on a display substrate in accordance with an embodiment.

DETAILED DESCRIPTION

Figure 1A:
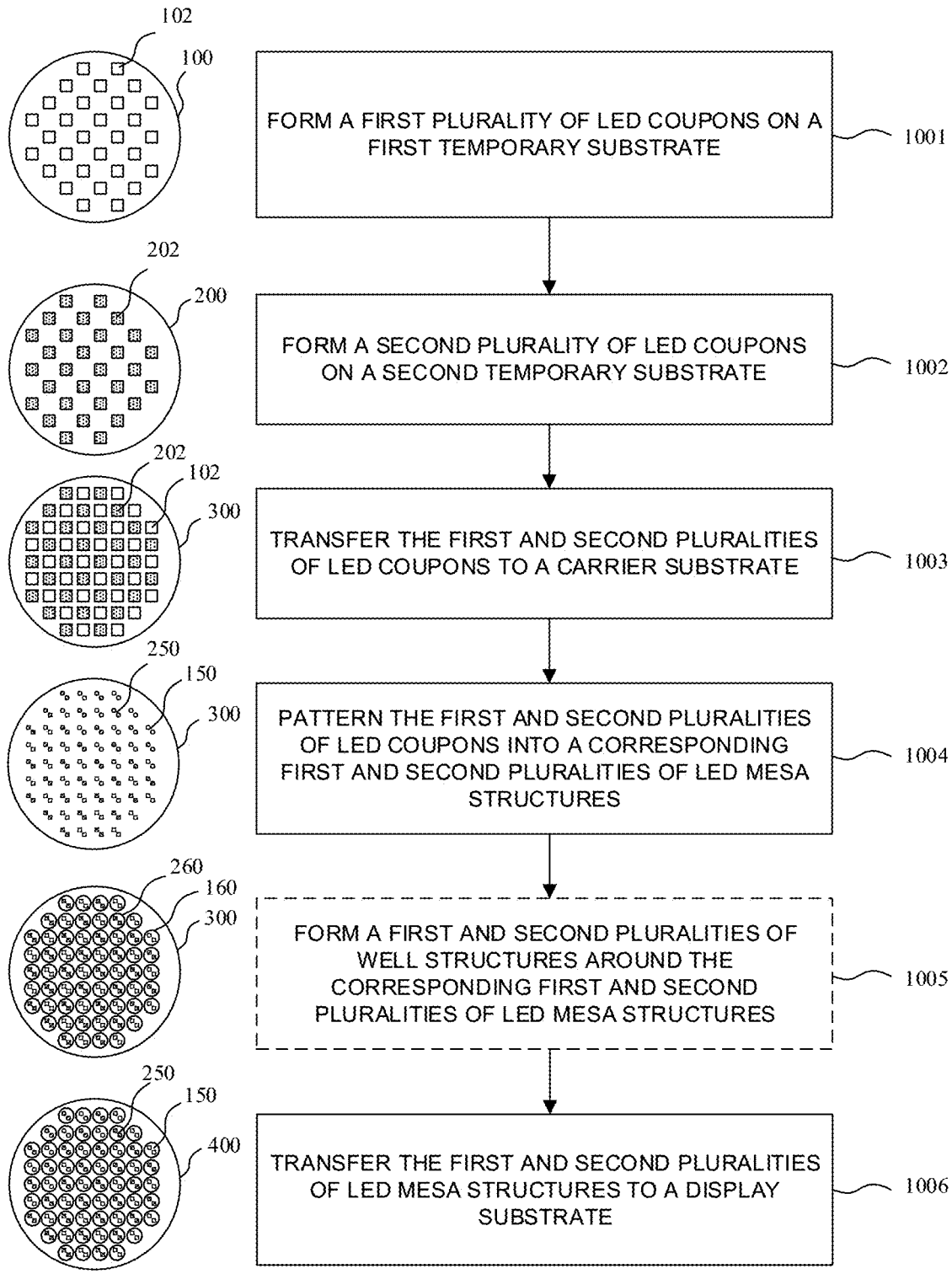
FIG. 1A includes a process flow and corresponding cross-sectional side view illustrations of a method of forming a light emitting structure in accordance with an embodiment.

Embodiments describe light emitting structures and methods of forming light emitting structures. In particular, the light emitting structures may be micro LED based display panels formed utilizing a process sequence in which LED coupons (or micro-tiles) are separately fabricated and then bonded to a common carrier substrate. All different color-emitting LED coupons may then be processed on the carrier substrate utilizing the same mask set to form pixel arrays of LED mesas on the carrier substrate. The processing sequence can also be utilized to form monochromatic displays with same color-emitting LED coupons. Additional processing may also be performed, such as the fabrication of optical elements (e.g. reflective well structures) around the LED mesas. The array of LED mesas (monochromatic or different color emitting) is then transferred together to a display substrate, along with the optional optical elements.

In one aspect, embodiments describe light emitting structures and methods of fabrication that may avoid fine tolerances (e.g. such as less than one micron) that may be necessary for direct transfer of micro LEDs from a native epitaxial substrate to a display substrate. For example, electrostatic transfer and bonding may be associated with elevated temperatures to reflow a bonding material used to bond the individually transferred micro LEDs to a display substrate. Thermal expansion mismatch associated with these elevated temperatures may require fine alignment tolerances and compensation techniques. Additionally, direct transfer of micro LEDs from a native epitaxial substrate to a display substrate may include allotment of additional surrounding area for fabrication of additional features, and optics. In accordance with embodiments, groups of larger LED coupons are first arranged side-by-side on a carrier substrate, and then patterned to the arrays of micro LED mesa structures that are then transferred as a group to the display substrate using wafer bonding techniques. In this manner, the requirement for fine alignment tolerances may be avoided, since it is larger LED coupons (e.g. on the order of whole subpixel size, or multiple subpixels) that are first transferred and heterogeneously integrated, followed by patterning to achieve small micro LEDs, such as with maximum lateral dimensions below 10 µm, such as 0.5 µm, 5 µm, or less. In a specific embodiment, the micro LEDs have a maximum lateral dimension of 1 µm.

In another aspect, the fabrication sequences in accordance with embodiments allow for heterogeneous integration from different substrates. For example, the LED coupons may originate from different epitaxial films formed on different growth substrates. In addition, the growth substrates, carrier substrates, and display substrates may be different sizes. In some embodiments, the epitaxial films originate from 6 inch growth substrates, the LED coupons are re-assembled on 12 inch carrier substrates, which are then wafer-wafer bonded to 12 inch display substrates, which may be 12 inch silicon CMOS wafers including pre-fabricated circuitry for display operation. In such processing sequences, re-assembly of the LED coupons onto 12 inch carriers facilitates throughput, where a significant amount of processing operations are performed to create the micro LED assemblies. It is to be appreciated, that while exemplary embodiments are described with regard to 6 inch and 12 inch wafers, these are exemplary, and embodiments are also applicable to different sizes.

In another aspect, embodiments describe light emitting structures and methods of fabrication in which optics for light extraction are fabricated on the micro LED mesa array prior to bonding to the display substrate. This allows for fabrication of the micro LED pixels and optical elements using a common mask set for all colors. This may facilitate maintaining the pitch and state of the art lithography tolerances across the entire carrier substrate for subsequent bonding to a display substrate. Furthermore, inclusion of the optical elements at this stage facilitates alignment, particularly for applications in which the optical elements direct (e.g. collimate) LED light to bolster on-axis intensity.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

FIG. 1A includes a process flow and corresponding cross-sectional side view illustrations of a method of forming a plurality of different color emitting LED coupons on a carrier substrate in accordance with an embodiment. At operation 1001 a first plurality of LED coupons 102 (e.g. A-coupons) is formed on a first temporary substrate 100 (e.g. temporary substrate-A). For example, temporary substrate may be a 12 inch wafer. This may be accomplished using a variety of processing sequences. For example, this may be accomplished by etching the first plurality of LED coupons into an epitaxial layer formed on a growth substrate (e.g. 6 inch wafer). The first plurality of LED coupons can then be transferred to the first temporary substrate using wafer bonding, followed by lift-off of the growth substrate. In an embodiment wafer bonding may be accomplished using an adhesive layer. Alternatively, the epitaxial layer can be transferred to the first temporary substrate, followed by patterning into first plurality of LED coupons. At operation 1002 a second plurality of LED coupons 202 (e.g. B-coupons) is formed on a second temporary substrate 200 (e.g. temporary substrate-B), which may also be a 12 inch wafer. This may be accomplished using similar processing sequences as operation 1001.

The first plurality of LED coupons 102 and the second plurality of LED coupons 202 are then transferred to a carrier substrate 300 (such as a 12 inch wafer) at operation 1003, and then patterned at operation 1004 to form a first plurality of LED mesa structures 150 and a second plurality of LED mesa structures 250, respectively. A first plurality of well structures 160, and second plurality of well structures 260 may then optionally be formed around the first and second pluralities of mesa structures 150, 250, respectively, at operation 1005. For example, the well structures may be reflective well structures. In an embodiment, formation of the reflective well structures includes depositing a first insulating layer over the first and second plurality of LED mesa structures 150, 250, patterning the first insulating layer to form a first plurality of insulating wells around the first plurality of LED mesa structures 150, and a second plurality of insulating wells around the second plurality of LED mesa structures 250, and forming a first plurality of reflective layers around the first plurality of insulating wells and a second plurality of reflective layers around the second plurality of insulating wells.

In accordance with embodiments, bottom contacts may be formed on the first and second pluralities of LED mesa structures 150, 250 while on the carrier substrate 300. At operation 1006, the first plurality of LED mesa structures 150 and the second plurality of mesa structures 250 are transferred to a display substrate 400. For example, transferring the first plurality of LED mesa structures 150 and the second plurality of mesa structures 250 to a display substrate 400 includes bonding the first plurality of bottom contacts and the second plurality of bottom contacts to the display substrate 400. In an embodiment, the display substrate 400 is a 12 inch silicon CMOS wafer.

It is to be appreciated, that while the process sequence illustrated in FIG. 1A is directed to the integration of first and second pluralities of LED mesa structures 150, 250 on a display substrate 400, that this is exemplary, and embodiments are not so limited. For example, the first plurality of LED mesa structures 150, and LED coupons 102 may be formed from an inorganic semiconductor layer stack (e.g. epitaxial p-n diode layer) designed for a first color emission, while the second plurality of LED mesa structures 250, and LED coupons 202 may be formed from an inorganic semiconductor layer stack (e.g. epitaxial p-n diode layer) designed for a second color emission. Embodiments are not limited to the integration of two different p-n diode layers designed for two different color emissions, and may include the integration of single p-n diode layers for single color emission, or one or more p-n diode layers designed other color emissions. Thus, embodiments may be utilized for the fabrication of full color or monochrome displays.

Figure 1B:
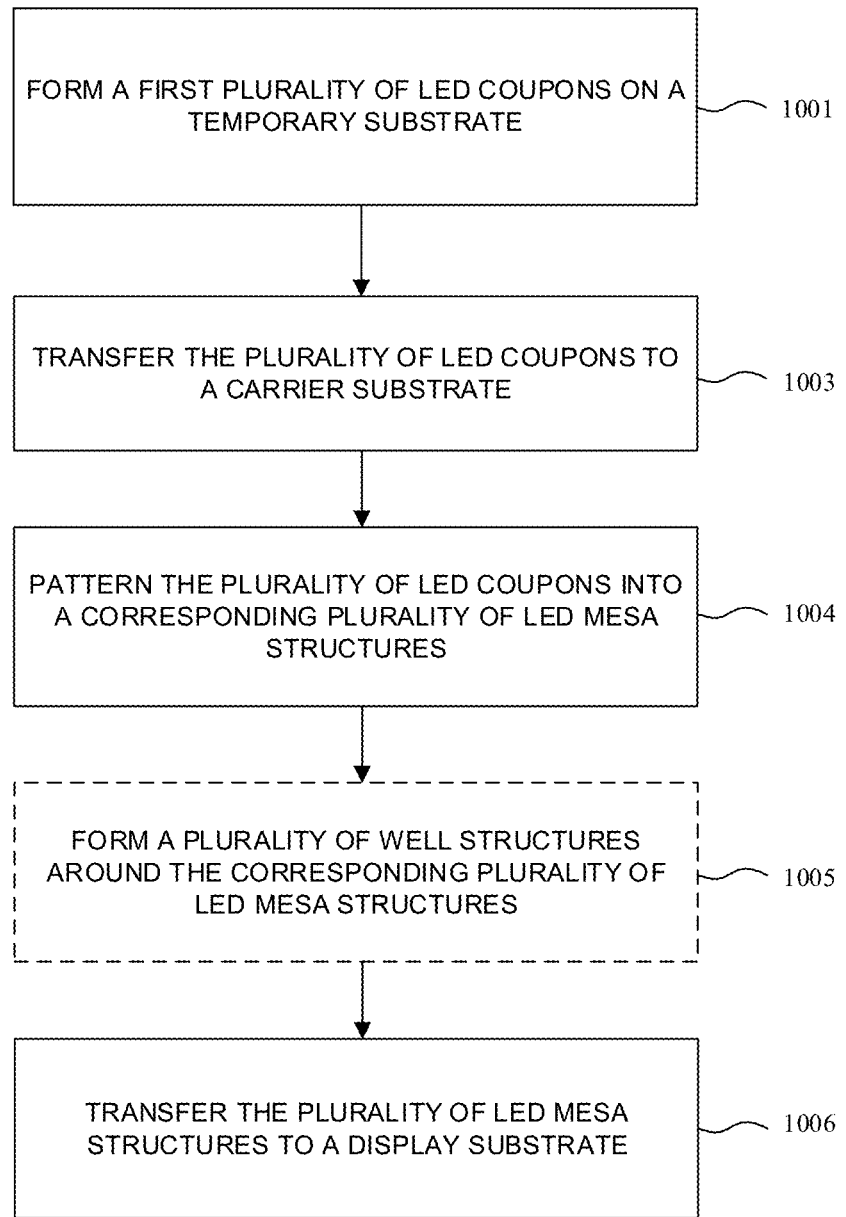
FIG. 1B includes a process flow of a method of forming a monochromatic light emitting structure in accordance with an embodiment.

FIG. 1B includes a process flow of a method of forming a monochromatic light emitting structure in accordance with an embodiment. The process flow of FIG. 1B is similar to that of FIG. 1A, except only a the first plurality of LED coupons is formed and transferred, etc. Otherwise, operations 1001, 1003, 1004, 1005, 1006 are similar.

Figure 2A:
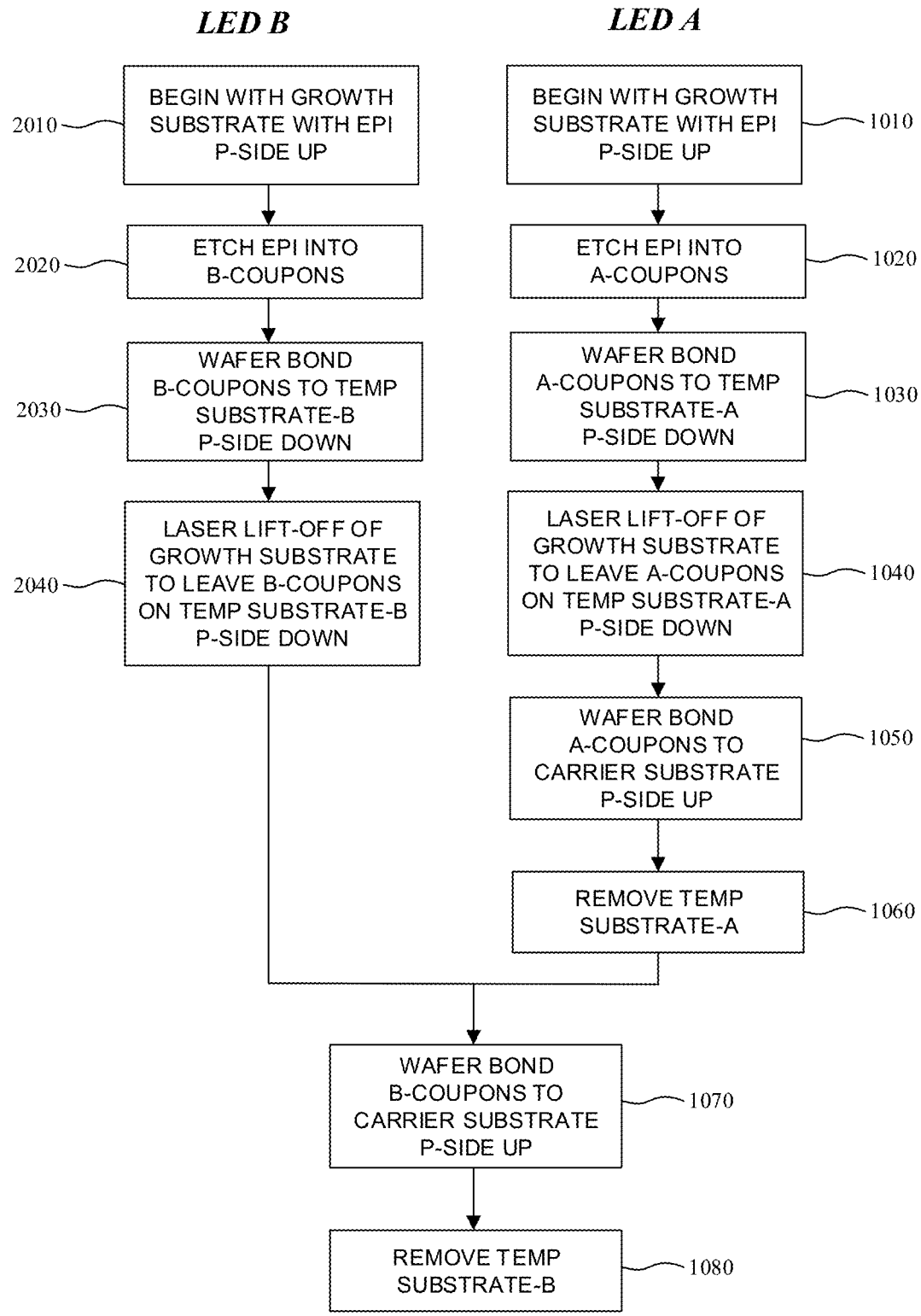
FIGS. 2A-2B are process flows of methods of forming a plurality of different color emitting LED coupons on a carrier substrate in accordance with embodiments.
Figure 2B:
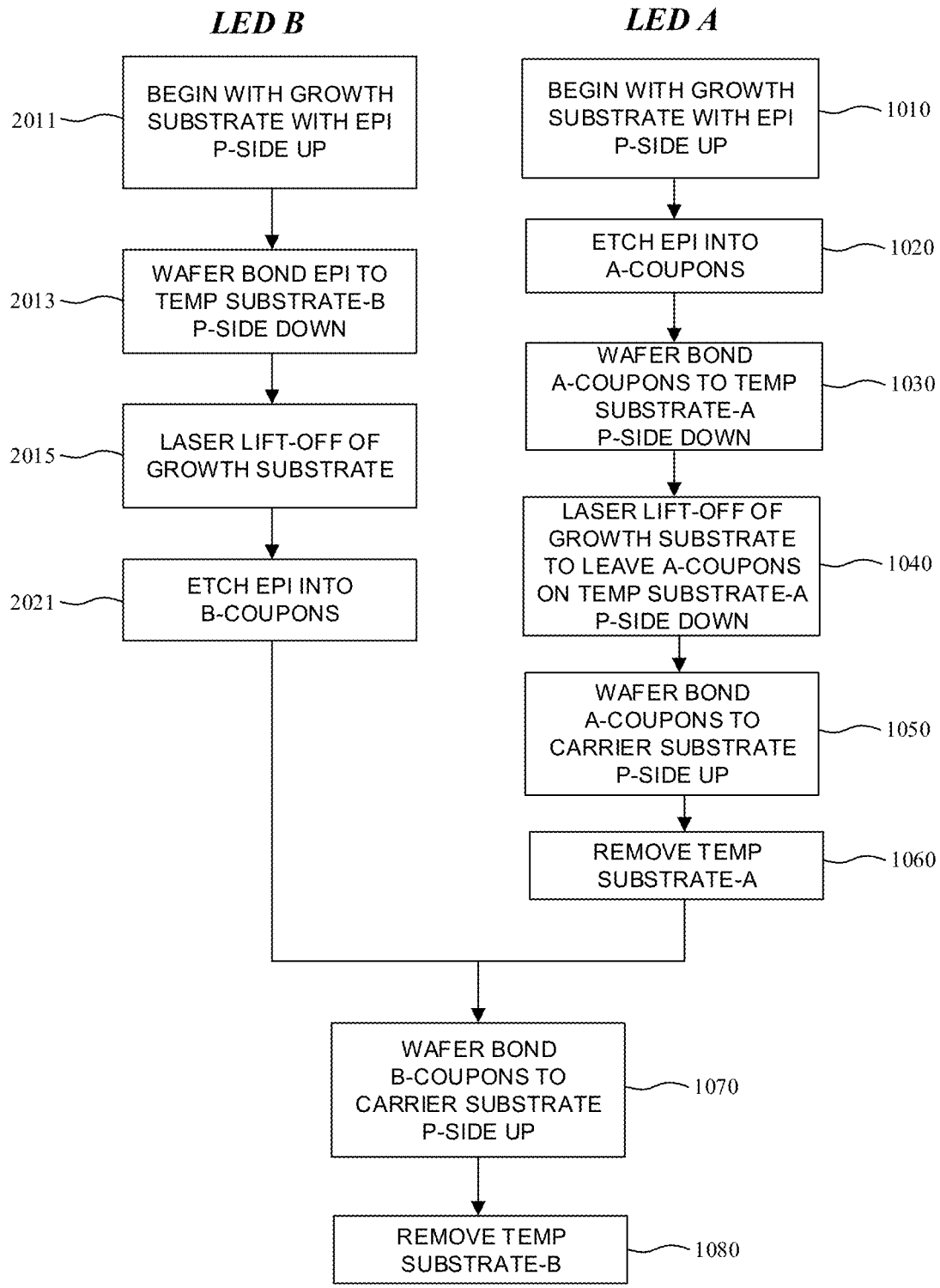

Referring now to FIGS. 2A-2B, process flows are provided of exemplary methods of forming a plurality of different color emitting LED coupons on a carrier substrate 300 in accordance with embodiments. In the following discussion, features such as a first plurality of LED coupons or first temporary substrate, etc. described with regard to FIG. 1A are referred to as "A-coupons" or "temporary substrate-A", etc. in interest of conciseness. Similarly, features such as a second plurality of LED coupons or second temporary substrate, etc. described with regard to FIG. 1A are referred to as "B-coupons" or "temporary substrate-B", etc. in interest of conciseness.

The particular process sequence illustrated in FIG. 2A is similar to that provided in FIG. 1A in regard that A-coupons and B-coupons are formed prior to being transferred to temporary substrates. FIG. 2B is illustrative of a process variation in which the B-coupons are formed after being transferred to a temporary substrate. Referring now to FIG. 2A, the process sequence may begin at operation 1010 with an epitaxial p-n diode layer formed on a first growth substrate (e.g. 6 inch wafer), with the p-side facing up. Thus, the epitaxial layer is formed on the growth substrate including an n-doped layer, active layer over the first n-doped layer, and a p-doped layer over the active layer. The epitaxial layer stack may include additional layers, though the only the p-n diode layers are referred to for conciseness. At operation 120 the epitaxial layer is etched into A-coupons 102. The A-coupons 102 are then bonded to a temporary substrate-A (e.g. 12 inch wafer) 100 at operation 1020, with p-side down and facing the temporary substrate-A 100, followed by removal of the growth substrate at operation 1040. For example, this may include etching, or laser lift-off, or a combination of both. In an embodiment, this may include laser lift-off of the growth substrate, followed by etching and polishing, resulting in the A-coupons 102 on temporary substrate-A 100. In an embodiment, the A-coupons 102 are secured on the temporary substrate-A 100 using an adhesive layer. A similar process sequence may be performed including operations 2010, 2020, 2030, 2040 to create the B-coupons 202 on a temporary substrate-B 200 (e.g. 12 inch wafer).

In no particular order, the A-coupons 102 and B-coupons 202 may then be transferred to a carrier substrate 300 (e.g. 12 inch wafer). For example, at operation 1050 the A-coupons 102 are bonded to the carrier substrate 300, followed by removal of the temporary substrate-A 100 at operation 1060. Bonding may be facilitated by the use of an adhesive layer. Likewise, the B-coupons 202 may be bonded to the carrier substrate 300, followed by removal of the temporary substrate-B 200 at operations 1070, 1080.

Referring now to FIG. 2B, a process sequence variation is illustrated in which the B-coupons 202 are not patterned until after transfer to temporary substrate-B 200. As shown, the process sequence for the B-coupons 202 may begin similarly at operation 2011 with an epitaxial p-n diode layer on a growth substrate, p-side up. The epitaxial layer is then bonded to temporary substrate-B at operation 2013, p-side down. In an embodiment, temporary substrate-B is a 6 inch wafer. This is followed by removal of the growth substrate at operation 2015, and etching of the epitaxial layer to form the B-coupons 202 at operation 2021. The remainder of the processing sequence may be similar to that of FIG. 2A. It is to be appreciated, that while the process sequence variation is provided for the formation of B-coupons 202 only, that this may be switched for A-coupons 102, or both may be processed using such a sequence.

In other embodiments, the A-coupons and/or B-coupons can be further patterned while on either of the temporary substrates to further divide the coupons into smaller coupons, which may then be transferred to the carrier substrate.

In accordance with embodiments, following the transfer of the A-coupons 102 and B-coupons 202 on the carrier substrate 300, the coupons may be processed together to form the arrays of LED mesa structures, as well as formation of various optical elements such as reflective well structures prior to being transferred to the display substrate. Such processing sequences can also be used for the formation of monochromatic displays.

FIGS. 2C-2D are process flows of methods of forming monochromatic color emitting LED coupons on a carrier substrate in accordance with embodiments. The process flow of FIG. 2C is identical to that of the process sequence for LED A in FIGS. 2A-2B. Likewise, the coupons can be patterned after transfer to the temporary substrate. FIG. 2D is a process flow illustration which shows processing similar to the process flow of LED B in FIG. 2B.

In another aspect, the LED coupons arranged on the carrier substrate 300 may be significantly larger than the resultant LEDs, and LED mesa structures. In accordance with embodiments, the LED coupons may be subpixel sized, include multiple subpixels within a single pixel, or include multiple subpixels within adjacent pixels that will be subsequently defined. In this manner, the processing sequences in accordance with embodiments first provide arrangements of the necessary coupons of epitaxial p-n diode layers adjacent one another on the carrier substrate, following by fine patterning to create the LEDs and pixel arrays. Such fine patterning may be performed using a common mask sequence, which may significantly alleviate alignment discrepancies that may occur when separately transferring different LEDs to the display substrate, such as with an array of electrostatic transfer heads. Furthermore, this may allow for the patterning and integration of smaller LEDs, such as less than 5 µm in maximum width. The integration of smaller LEDs in turn frees up additional space and allows for the integration of additional optical elements within the pixel structures.

Figure 3A:
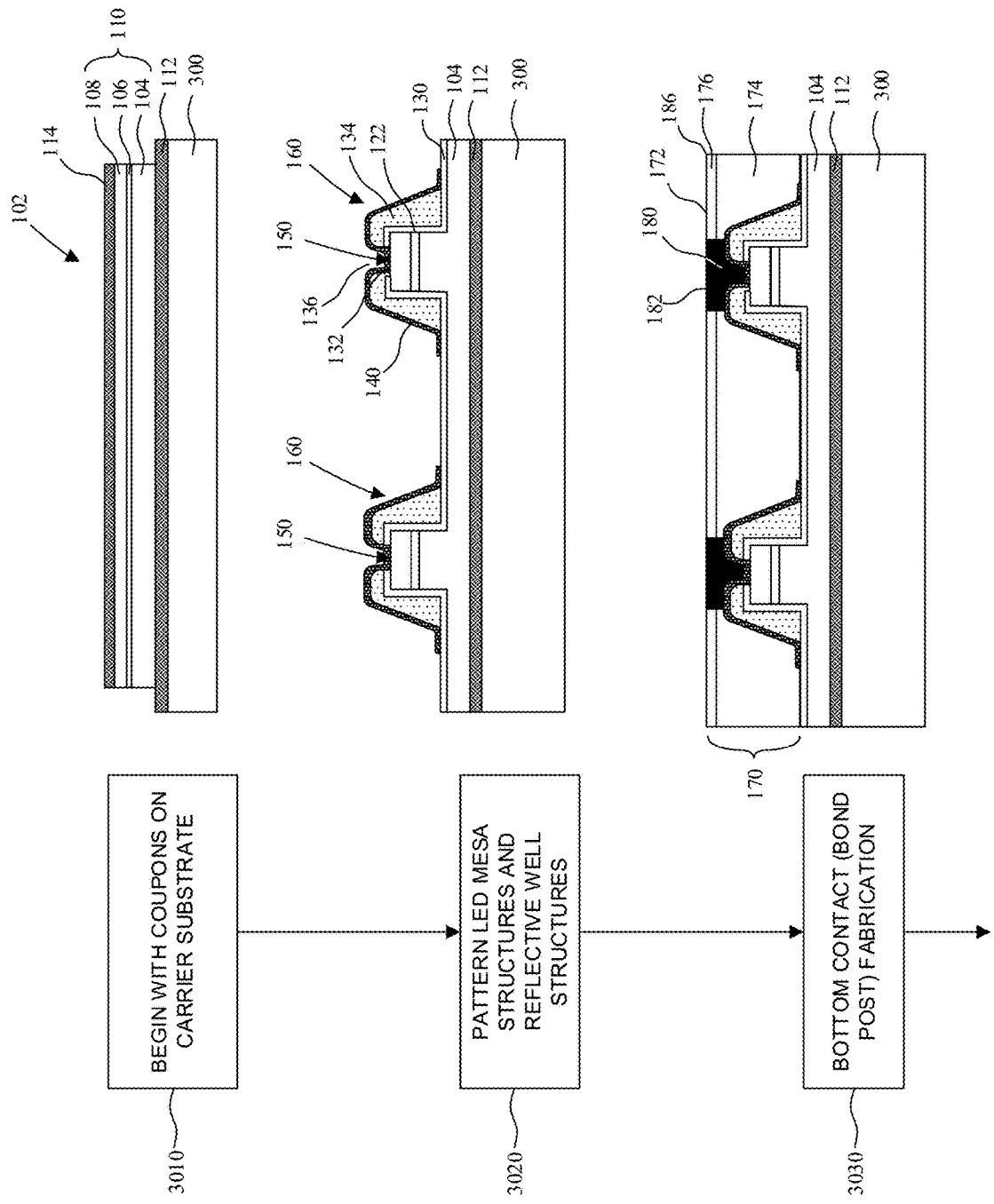
FIG. 3A includes a process flow and corresponding cross-sectional side view illustrations of a method of patterning a pair of LED mesa structures from an LED coupon on a carrier substrate in accordance with an embodiment.

Referring now to FIG. 3A a process flow and corresponding cross-sectional side view illustrations are provided of a method of patterning a pair of LED mesa structures from an LED coupon on a carrier substrate in accordance with an embodiment. Thus, FIG. 3A illustrates a processing sequence of a single LED coupon on a carrier substrate, though it is to be appreciated that the processing sequence may be performed on an array of different LED coupons on the carrier substrate using a common mask set. The embodiment illustrated may begin at operation 3010 with A-coupon 102 mounted on carrier substrate 300 with an adhesive layer 112. The A-coupon may have been formed from an epitaxial p-n diode layer 110 including an n-doped layer 104, active layer 106, and p-doped layer 108. An adhesive layer or residue 114 may optionally be over the p-doped layer 108 as a result from being transferred to the carrier substrate 300 from temporary substrate-A.

At operation 3020 A-coupon 102 is patterned into one or more LED mesa structures 150, and the optional (reflective) well structures 160 may be formed around the one or more LED mesa structures 150. In an embodiment, A-coupon 102 is patterned to form one or more LED mesa structures 150 for a single subpixel (e.g. blue, green, or red subpixel within a red-green-blue pixel). A-coupon 102 may also be patterned to form one or more LED mesa structures within multiple subpixels (e.g. blue and red) of a single pixel, or multiple subpixels within multiple subpixels (various possibilities).

The LED mesa structures 150 may be formed using a suitable etching technique (e.g. dry), and hardmask, such as $HfO_x$. An optional sidewall passivation layer 130 may then be formed on mesa sidewalls 122. For example, sidewall passivation layer 130 may be formed by atomic layer deposition. An exemplary material is $Al_2O_3$, or other suitable dielectric material. Sidewall passivation layer 130 may then be patterned to form openings 132 that will expose the bottom surface LED mesa structure 150.

In an embodiment, well structures 160 are then formed around the LED mesa structures 150. In one implementation, a well material 134 is formed of one or more insulation materials. In an embodiment, the well material 134 is a polymer or glass material. The well material 134 may additionally include scattering particles dispersed in a matrix (e.g. polymer or glass) to function as a diffuser. In such a structure, the propagation length of light between scattering events may be quite small, giving the light emitted from the LEDs opportunity to be extracted. Exemplary diffusers may include a transparent well material 134 filled with scattering particles. The transparent well material 134 may also be a low index material, high index material, or share a same index of refraction as an overlying layer.

In an embodiment, the well material 134 is deposited, and patterned to form the well structures. Suitable technique include but are not limited to spin-on, spray coat, inkjet, slot coat, etc. In an embodiment, the well material 134 is selected to have an index of refraction that is lower than an index of refraction of the LED mesa structures 150 to facilitate light extraction. In the particular embodiment illustrated in FIG. 3A, the well material 134 is completely removed between the LED mesa structures 150, resulting in discrete, separate well structures 160. In other embodiments, a single well structure 160 may surround multiple LED mesa structures 150. For example, a single well structure may be formed around a pair of redundant LED mesa structures 150. Additional configurations are possible. In some embodiments, the well material 134 is not completely removed between the LED mesa structure 150, and a layer of the well material may connect adjacent well structures 160. Such an embodiment may result in a structure in which the top surfaces of the LEDs to be fabricated will extend above the well structures (see FIG. 7, for example). The well material 134 is additionally patterned to form openings 136 over the bottom surfaces of the LED mesa structures 150 to expose a surface for making electrical contact. For example, openings 136 may be within or overlap openings 132 in the sidewall passivation layer 130.

Following the formation of the well structures 160, a reflective layer may optionally be deposited and patterned to form reflective layers 140 around the well structures. The reflective layers 140 may be continuous layers that span around and underneath the corresponding LEDs (to be completed) and within an opening in the well material 134 directly underneath the LEDs. As shown, the reflective layers 140 span long sidewalls of the well structures 160, and within the openings 136, 132 in the well structures 160 and sidewall passivation layer 130. The reflective layers 140 may be formed directly on a bottom surface of the LED mesa structures 150 in some embodiments. In other embodiments, a contact layer (e.g. indium-tin-oxide) is pre-formed on the epitaxial p-n diode layer prior to forming the LED mesa structures 150. In this manner, the reflective layers 140 may be formed directly on the contact layer on the bottom surface of the LED mesa structures 150. The reflective layers 140 may be formed of a variety of reflective materials, and may be different depending upon composition of the LED mesa structures 150. Accordingly, different reflective layers 140 may be formed over different LED coupons. Exemplary materials include, but are not limited to, aluminum, silver, gold, etc.

Still referring to FIG. 3A, to bottom contacts 180 (i.e. bond posts) are fabricated at operation 3030. In an embodiment bottom contacts 180 are formed using a suitable technique such as plating. A fill layer 170 (e.g. planarization layer) may then be blanket deposited, such as with a spin on technique, spray coating, etc. The fill layer 170 may then be planarized to create a planar surface 186 including planar surface 172 of the fill layer 170, and planar surfaces 182 of the bottom contacts. Fill layer 170 may be formed of a suitable insulating material such as a polymer or glass. In an embodiment, in which reflective layers 140 are not formed, the well material 134 is selected to have an index of refraction that is higher than an index of refraction of the fill layer 170 to take advantage of reflection by total internal reflection.

The order of forming bottom contacts 180 and fill layer 170 may also be reversed, with the fill layer 170 being formed, followed by patterning, formation of the bottom contacts 180 (e.g. by plating), and planarization to create the planar surface 186. The fill layer 170 may also include multiple layers. For example, the fill layer 170 may include a bulk layer 174 (e.g. formed by a spin on technique, spray coating, etc.), followed by growth of an oxide bonding layer 176, such as a high quality oxide (e.g. silicon oxide), to facilitate hybrid bonding.

Referring now to FIG. 3B the LED mesa structures are then integrated on a display substrate 400. At operation 3040 the LED mesa structures 150 are bonded to a display substrate 400. More specifically, the bottom contacts 180 are bonded to electrode pads 410 on a display substrate 400. Bonding may be achieved using a variety of methods. In a specific embodiment, a hybrid bonding technique is utilized in which a bottom surface 182 of the bottom contacts 180 is bonded to a top surface 412 of the electrode pads 410 with a metal-metal bond, and a bottom surface 172 of the fill layer 170 (e.g. oxide bonding layer 176) is bonded to a top surface 422 of the display substrate 400 with an oxide-oxide bond. For example, top surface 422 may also be a top surface of an oxide bonding layer 404, such as a high quality oxide (e.g. silicon oxide), of the display substrate. In accordance with embodiments, hybrid bonding may be facilitated by bonding of planarized surfaces 172, 422. The display substrate 400 may be a variety of substrates including polymer, glass, silicon, etc. and may be rigid or flexible. In an embodiment, the display substrate includes a silicon substrate 402. For example, the display substrate 400 may be a complementary metal-oxide-semiconductor (CMOS) wafer including circuitry to address the LEDs bonded to the electrode pads 410.

The carrier substrate 300 may then be removed at operation 3050. This may be followed by thinning of the epitaxial p-n diode layer to form discrete LEDs 175. For example, this may include thinning of the n-doped layer 104 and/or a buffer layer. Individual n-contacts may optionally be formed on the LED mesa structures of the LEDs 175. A top electrode layer 190 is then formed over the LEDs 175 at operation 3060. The top electrode layer 190 may be a common layer shared by multiple LEDs 175, across multiple pixels in some embodiments. The top electrode layer 190 may additionally be formed on a contact terminal 420. For example, the contact terminal may connect to ground or low voltage (Vss) line. As shown, the contact terminal 420 may be in the form of a plug or via extending through the fill layer 170. In an embodiment, contact terminal 420 is on a corresponding contact pad 411 of the display substrate 400. The contact terminal 420 may be formed at a variety of stages. For example, the contact terminal 420 may be formed along with the bottom contacts at operation 3030. In such an embodiment, the contact terminal 420 may be bonded to the contact pad 411 with a metal-metal bond during a hybrid bonding technique. The contact terminal 420 may optionally be formed after removing the carrier substrate at operation 3050.

Figure 4:
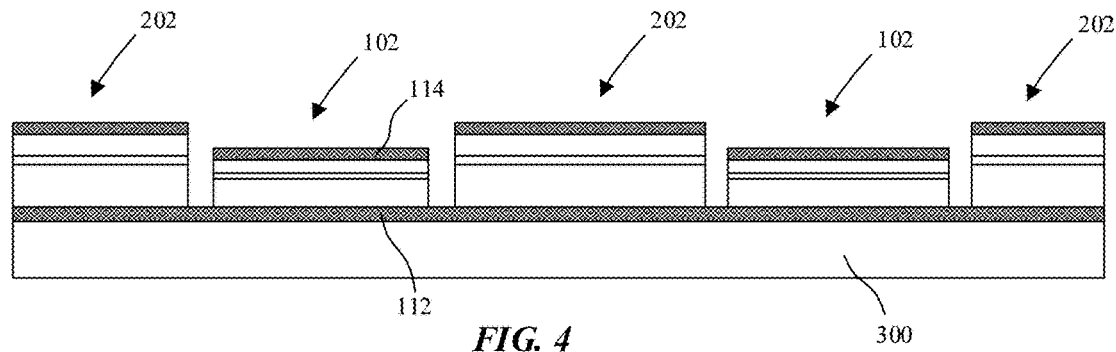
FIG. 4 is a schematic cross-sectional side view illustration of two pluralities of different color emitting LED coupons on a carrier substrate in accordance with an embodiment.
Figure 5:
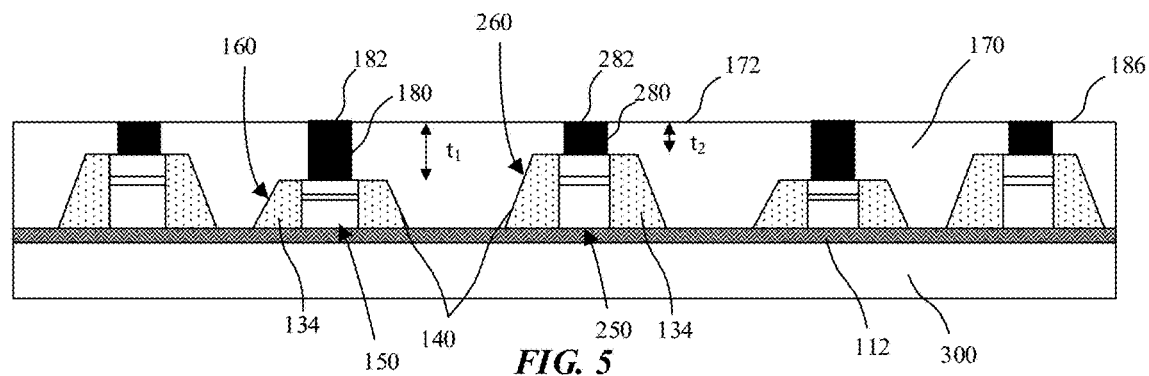
FIG. 5 is a schematic cross-sectional side view illustration of two pluralities of different color emitting LED mesa structures, with corresponding well structures and bottom contacts formed on a carrier substrate in accordance with an embodiment.
Figure 6:
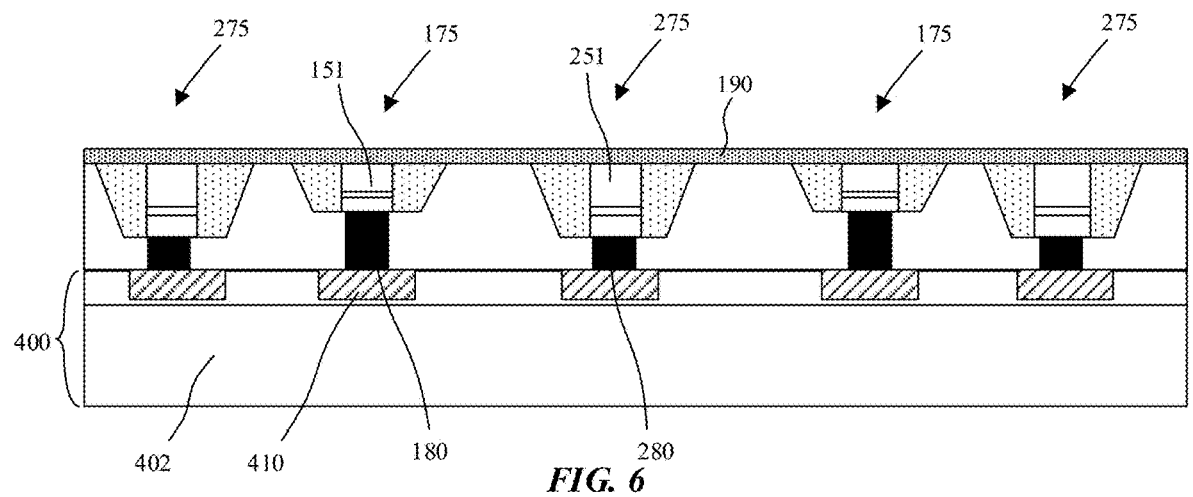
FIG. 6 is a schematic cross-sectional side view illustration of a plurality of different color emitting LEDs bonded to a display substrate in accordance with an embodiment.

The process sequence of FIGS. 3A-3B illustrates processing of a single LED coupon (A-coupon) 102, though the process sequence may be global process sequence for multiple different LED coupons, and use a common mask set. FIGS. 4-6 are schematic cross-sectional side view illustrations of such a global process sequence for multiple different LED coupons in accordance with an embodiment. The process beginning at FIG. 4 may correspond to that provided in FIG. 3A, operation 3010. As shown, FIG. 4 is a schematic cross-sectional side view illustration of two pluralities of different color emitting LED coupons 102, 202 on a carrier substrate 300 in accordance with an embodiment. As shown the different LED coupons 102 (A-coupons), 202 (B-coupons). FIG. 5 is a schematic cross-sectional side view illustration after the different LED coupons 102, 202 have been patterned into two pluralities of different color emitting LED mesa structures 150, 250, with corresponding well structures 160, 260 and bottom contacts 180, 280 in accordance with an embodiment. FIG. 5 illustrates particular distinguishing features that may arise in accordance with embodiments. In particular, the LED coupons 102, 202 designed for different color emissions may be formed of different materials, have different layer stack structures, and significantly, have different thicknesses. This may result in the LED mesa structures 150, 250 having different thicknesses, as well as the well structures 160, 260 having different heights (or thicknesses). In order to facilitate bonding the heterogeneous collection of materials and structures to the display substrate 400, the bottom contacts 180, 280 may have different corresponding thicknesses $t_1$, $t_2$ to preserve planarity of the bottom surface 186 including the bottom surface 172 of the fill layer 170, and bottom surfaces 182, 282 of the bottom contacts 180, 280. FIG. 6 is a schematic cross-sectional side view illustration of a plurality of different color emitting LEDs 175, 275 bonded to a display substrate 400 in accordance with an embodiment. For example, FIG. 6 may correspond the structure illustrated in FIG. 3B corresponding to operation 3060.

A light emitting structure in accordance with an embodiment includes an LED 175 bonded to an electrode pad 410 of a substrate 400, such as a CMOS substrate. The LED includes an inorganic semiconductor-based p-n diode, and a metallic bottom contact 180 bonded to the electrode pad 410. An insulating fill layer 170 is laterally around the LED 175 and the metallic bottom contact 180. In some embodiments, a planar bottom surface 182 of the metallic bottom contact 180 is bonded to a planar top surface 412 of the electrode pad 410 with a metal-metal bond, and a planar bottom surface 172 of the insulating fill layer 170 is bonded to a planar top surface 422 of the substrate 400 with an oxide-oxide bond.

The LED 175 may be mounted within a well structure 160 embedded within the insulating fill layer 170. The well structure 160 may be a reflective well structure, including a reflective metal layer 140 laterally around a well material 134, where the well material 134 is laterally around the LED 175 within the well structure 160. The reflective metal layer 140 may be a continuous layer that spans around and underneath the LED 175, and within an opening 136 in the well material 134 directly underneath the LED.

A light emitting structure in accordance with an embodiment includes a first LED 175 formed of a first inorganic semiconductor-based p-n diode 151 designed to emit a first color emission, and a first metallic bottom contact 180 bonded to a first electrode pad 410, and a second LED 275 formed of a second inorganic semiconductor-based p-n diode 251 designed to emit a second color emission different from the first color emission, and a second metallic bottom contact 280 bonded to a second electrode pad 410. As shown in FIG. 6, the first metallic bottom contact 180 is thicker than the second metallic bottom contact 280, and the second inorganic semiconductor-based p-n diode 251 is thicker than the first inorganic semiconductor-based p-n diode 151. Additionally, the bottom surfaces 182, 282 of the first and second metallic bottom contacts 180, 280 are co-planar. In an embodiment, the top surfaces of the first and second inorganic semiconductor-based p-n diodes 151, 251 are co-planar. In an embodiment, the first metallic bottom contact 180 is thicker than the second metallic bottom contact 280 by a first thickness, and the second inorganic semiconductor-based p-n diode 251 is thicker than the first inorganic semiconductor-based p-n diode 151 by approximately the first thickness.

In an embodiment, the first LED 175 is mounted within a first (reflective) well structure 160, and the second LED 275 is mounted within a second (reflective) well structure 260. As illustrated, the second well structure 260 may be taller than the first well structure 160. The first and second well structures 160, 260 and the first and second metallic bottom contacts 180, 280 are embedded within an insulating layer (fill layer 170). The bottom surfaces 172, 182, 282 of the insulating fill layer 170 and bottom contacts 180, 280 may be co-planar.

While embodiments including LEDs for different color emissions are described and illustrated as including different epi-thicknesses, and resultantly, different metallic bottom contact thicknesses, and well structure heights, this is not required. For example, additional wafer transfer operations may be performed during fabrication of the LED coupons such that the different types of LED coupons are bonded to a temporary substrate n-side up, and polished together to achieve a common thickness. Alternative processing sequences are also envisioned. As a result, a light emitting structure processed in such a manner may include LEDs with uniform thickness, as well as uniform thicknesses or heights of the bottom metallic bottom contacts, and/or well structures, depending upon the fabrication sequence and mask sets.

Figure 7:
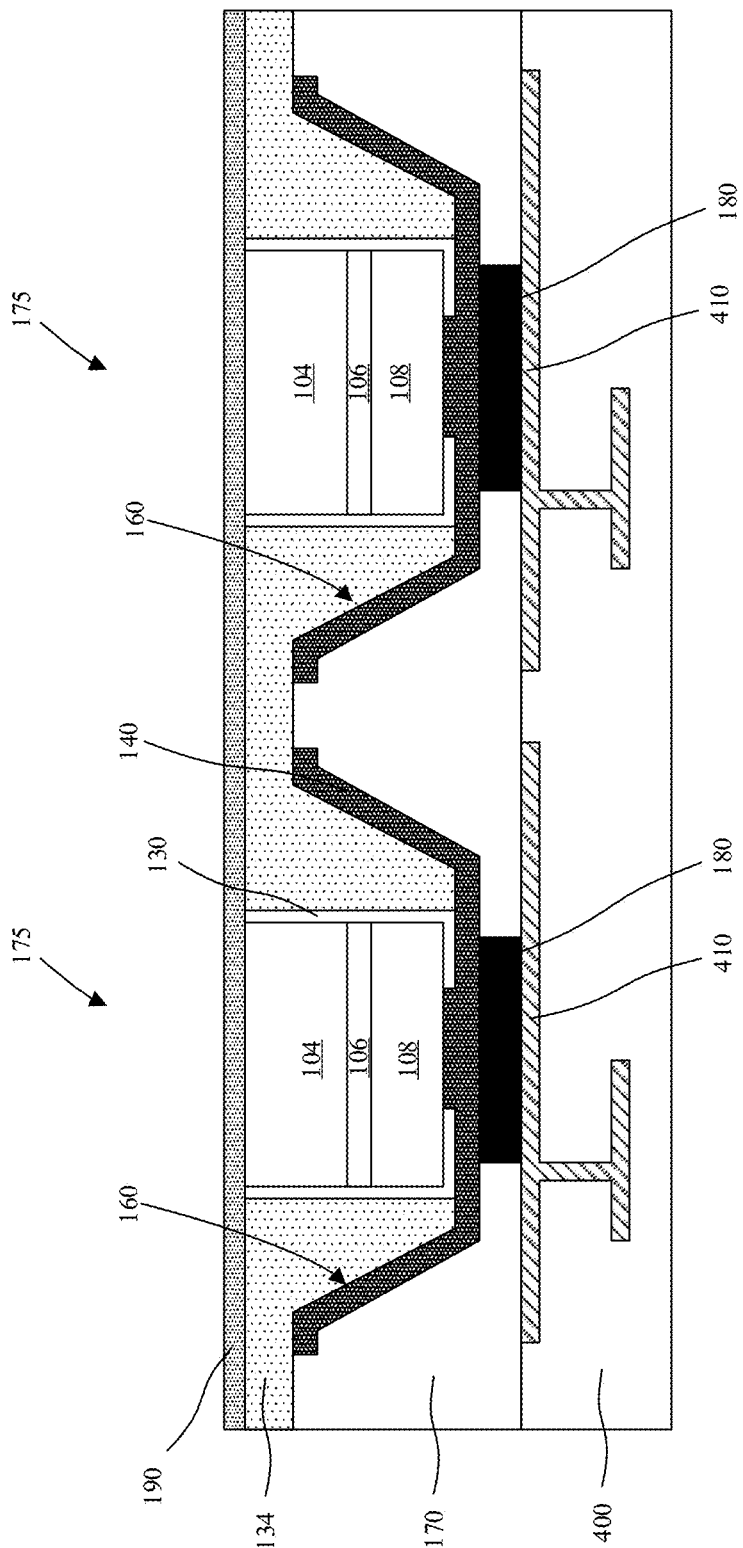
FIG. 7 is a schematic cross-sectional side view illustration of a pair of LEDs mounted within reflective well structures on a display substrate in accordance with an embodiment.

In accordance with embodiments the LED coupons may be patterned to form a plurality of LEDs. For example, they may be patterned to form pairs of redundant LEDs within subpixels. FIG. 7 is a schematic cross-sectional side view illustration of a pair of LEDs 175 mounted within reflective well structures on a display substrate 400 in accordance with an embodiment. The particular embodiment illustrated in FIG. 7 includes a particular process variation in which the well material 134 is not completely removed between the adjacent LEDs 175. As a result, the LEDs 175 may extend above the well structures 160. It is understood, such a process variation is optional, and the well material 134 may be completely removed between adjacent LEDs 175 in other embodiments. Additionally, in other embodiments, the well structures 160 may overlap, and may have a shared reflective layer 140.

Figure 8:
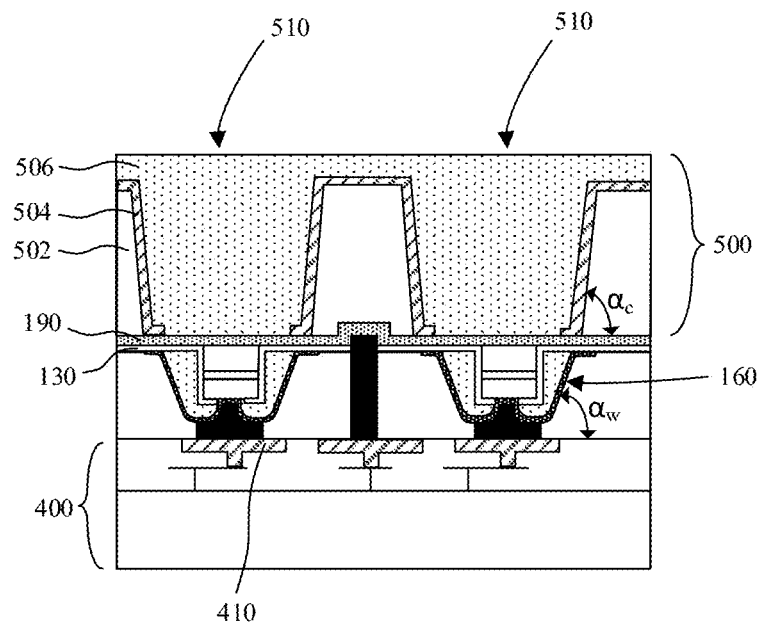
FIG. 8 is a schematic cross-sectional side view illustration of a pair of micro-optic elements formed over a pair of LEDs on a display substrate in accordance with an embodiment.
Figure 9A:
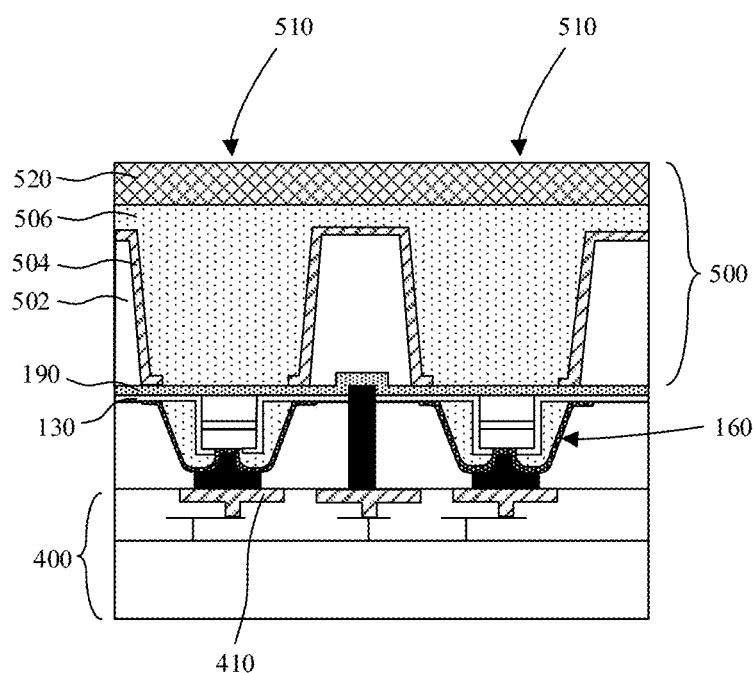
FIG. 9A is a schematic cross-sectional side view illustration of pair of micro-optic elements including a filter formed over a pair of LEDs on a display substrate in accordance with an embodiment.
Figure 9B:
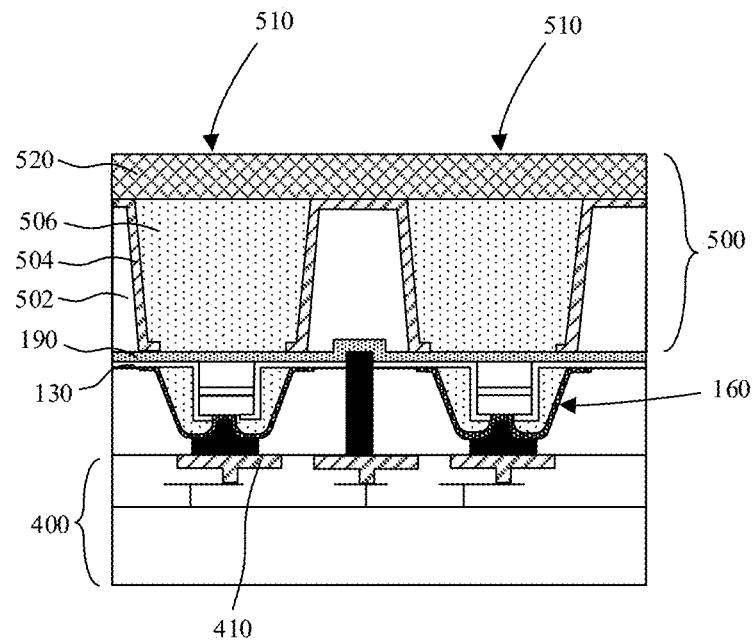
FIG. 9B is a schematic cross-sectional side view illustration of pair of micro-optic elements encapsulated with a filter formed over a pair of LEDs on a display substrate in accordance with an embodiment.

Additional optics 500 (e.g. in addition to the reflective well structures) may be fabricated after transfer of the LEDs to the display substrate. For example, additional optics 500 may be designed for color conversion, spectral filtering, angular filtering, and/or light shaping to facilitate on-axis light transmission. FIG. 8 is a schematic cross-sectional side view illustration of a pair of micro-optic elements 510 formed over a pair of LEDs 175 on a display substrate 400 in accordance with an embodiment. FIG. 9A is a schematic cross-sectional side view illustration of a pair of micro-optic elements 510 including a filter 520 formed over a pair of LEDs 175 on a display substrate 400 in accordance with an embodiment. FIG. 9B is a schematic cross-sectional side view illustration of pair of micro-optic elements encapsulated with a filter formed over a pair of LEDs on a display substrate in accordance with an embodiment.

In accordance with embodiments, the (reflective) well structures 160 may have reflective sidewalls shaped for on-axis emission direction (e.g. orthogonal to display substrate 400). Micro-optic elements 510 may optionally be formed of the LEDs 175 to additionally convert, filter, and/or shape the emitted light. An exemplary micro-optic element 510 may include a bank layer 502, and optional reflective layer 504 on sidewalls of the bank layer 502. Reflective layer 504 may be formed of similar materials as reflective layer 140, such as aluminum, silver, gold, etc. An optical material 506 is formed within bank openings in the bank layer 502 directly above the LEDs 175. The optical material 506 may be formed of similar materials as the fill material 134, such as polymers or glass. Additionally, the optical material may be selected for transparency, or refractive index. In some embodiments, the optical material 506 may be filled with a color conversion material such as quantum dots. For example, the quantum dots may be designed for absorption of a primarily blue emission wavelength from the LEDs 175, and emission of a primarily red emission wavelength, although other configurations are possible.

In an embodiment, the micro-optic elements 510 are designed for color conversion. For example, the optical material 506 may be filled with a color conversion material such as quantum dots, and sidewalls of openings in the bank layer 502 are lined with a reflective layer 504. The reflective layer 504 may additionally function to prevent bleeding of light emitted from the optical material between subpixels. In an embodiment, bank layer 502 openings, reflective layer 504, include sidewalls characterized by an angle to horizontal ($\alpha_c$). In accordance with embodiments, the micro-optic element 510 angle to horizontal ($\alpha_c$) and the well structure angle to horizontal ($\alpha_w$) are specific to application. In an exemplary embodiment, in which the micro-optic elements 510 are designed for color conversion, the micro-optic element 510 angle to horizontal ($\alpha_c$) is 45-60 degrees, and the well structure 160 angle to horizontal ($\alpha_w$) is 50-80 degrees, or more specifically 60-80 degrees. Such a configuration may also be utilized to increase on-axis light extraction efficiency, and more specifically within +/−7 degrees of the horizontal angle (90 degrees).

In an embodiment, the micro-optic elements 510 are designed for light shaping, for example to facilitate on-axis light transmission. Optical material 506 may be formed of a high index material (e.g. index of refraction greater than that of bank layer 502). For example, optical material 506 may have a refractive index greater than 1.6, while the bank layer 502 is formed of a lower index materials, e.g. less than 1.5, such that the total internal reflection serves to collimate light. Optional reflective layer 504 may also be present. In an embodiment, the micro-optic elements include sidewalls characterized by an angle to horizontal ($\alpha_c$) that is greater than the angle to horizontal ($\alpha_w$) for the reflective sidewalls of the well structure 160. In an exemplary embodiment the angle to horizontal ($\alpha_c$) is approximately 70-85 degrees, while the well structure angle to horizontal ($\alpha_w$) is 50-80 degrees, or more specifically 55-65 degrees, such as approximately 60 degrees. Such a configuration may be utilized to increase on-axis light extraction efficiency, and more specifically within +/−7 degrees of the horizontal angle (90 degrees).

Figure 9C:
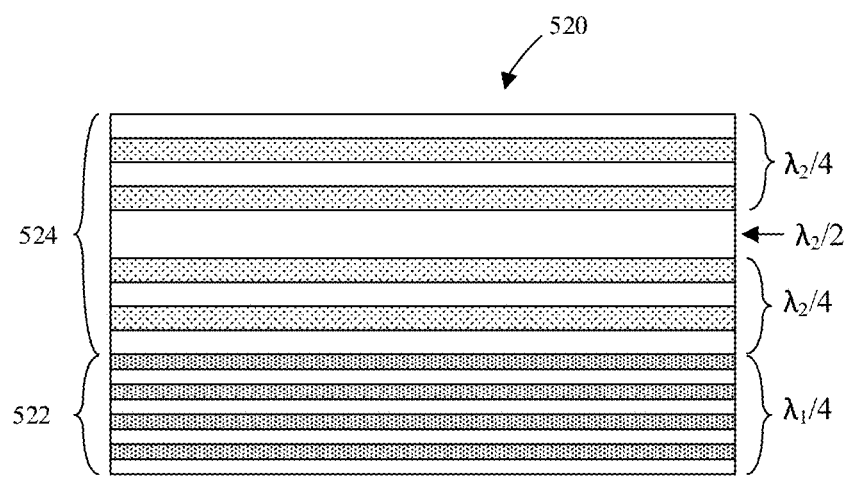
FIG. 9C is a schematic cross-sectional side view illustration of a filter including a recycling portion and a collimation portion in accordance with an embodiment.

Referring now to FIGS. 9A-9C, a filter 520 may optionally be included. Filter 520 may be particularly applicable in a configuration in which the micro-optic elements 510 are designed for color conversion. FIG. 9B differs from FIG. 9A in that the optical material 206 is confined inside the bank openings, and capped with the filter 520. Such a configuration may achieve improved encapsulation of the optical material 206 (e.g. to protect against moisture and oxidation), particularly for an optical material 206 that contains quantum dots. The filter 520 may have a specific function such as a spectral filter and/or angular filter. Exemplary angular filters include a low index volume (e.g. for angular filter) characterized by an index of refraction less than 1.4, distributed Bragg reflector (DBR) structure or other specialized optical film. Exemplary low index volumes may include a void such as a vacuum, air gap, or other inert gas-filled region, or a low index matrix. In such a configuration, the angular filter counteracts the tendency of light to otherwise be trapped by overcoat layer interfaces by total internal reflection (TIR) effects. More specifically, in accordance with embodiments the angular filter 520 only permits light to first escape beyond the angular filter that can then escape the full overcoat film stack in the display. Thus, the light that has no chance of escaping the display is reflected back into the underlying structure where it can be scattered once more into a mode which may then escape. Thus, the angular filter keeps light confined until it is re-directed to a sufficiently steep angle which allows such light to escape the display system to ambient. Various DBRs may also, or alternatively be used as spectral filters, such as a band stop DBR (e.g. reflecting only blue light from underlying LED for QD absorption and conversion to red light, while passing other wavelengths) or long pass DBR (e.g. blocks all wavelengths below red wavelength). In an embodiment, particles or dyes are included within a spectral filter to absorb specific wavelengths.

In the particular embodiment illustrated in FIG. 9C, the filter 520 can be a multiple layer stack of comparable high and low index materials, and include a recycling (reflection) portion 522 and a collimation portion 524, which may be over the recycling portion 522. The recycling (reflection) portion 522 may reflect light (e.g. blue) from an underlying (pump) LED 175, while the collimation portion 524 may only pass light emitted (e.g. red) from the quantum dots within the optical material 206 that is approximately at normal incidence. Thus, the light not at normal incidence is reflected back by the collimation portion 524 where the light can be redirect, with another opportunity to pass at normal incidence. Such a configuration may increase on-axis intensity. Materials selection of layers within the filter 520 may also function to encapsulate the optical material 206 and provide a barrier to moisture and oxidation (e.g. particularly when quantum dots are present for color conversion). The filter 520 may include an encapsulation material such as silicon nitride. In an embodiment, the planarity of the filter 520 layer is kept such that a slope of less than 20 degrees to horizontal is maintained in order to ensure layer continuity for sufficient encapsulation integrity.

In a particular embodiment the recycling portion 522 includes pairs (e.g. 3-5 pairs) of high/low index material layers, with each layer having a thickness of $\kappa_1/4$ of the LED 175 primary emission wavelength ($\lambda_1$). For example, the LED 175 primary emission wavelength may be blue (~465 nm). The collimation portion 524 on the other hand may have $\lambda_2/2$ layer sandwiched between pairs (e.g. 2 pairs) on each side of high/low index material layers, with each layer having a thickness of $\lambda_2/4$ of the QD primary emission wavelength ($\lambda_2$). For example, the QD primary emission wavelength may be red (~640 nm).

The LEDs 175, 275 processed from LED coupons 102, 202 in accordance with embodiments may be integrated in a variety of pixel structures. In particular, the LEDs 175, 275 can be transferred to a display substrate 400 including pre-fabricated optical elements (e.g. reflective well structures). The well structures may have separate dimensions, components while also being processes using a common mask set on a carrier substrate. Additional optics 500 may be added after transfer to the display substrate 400.

Figure 10A:
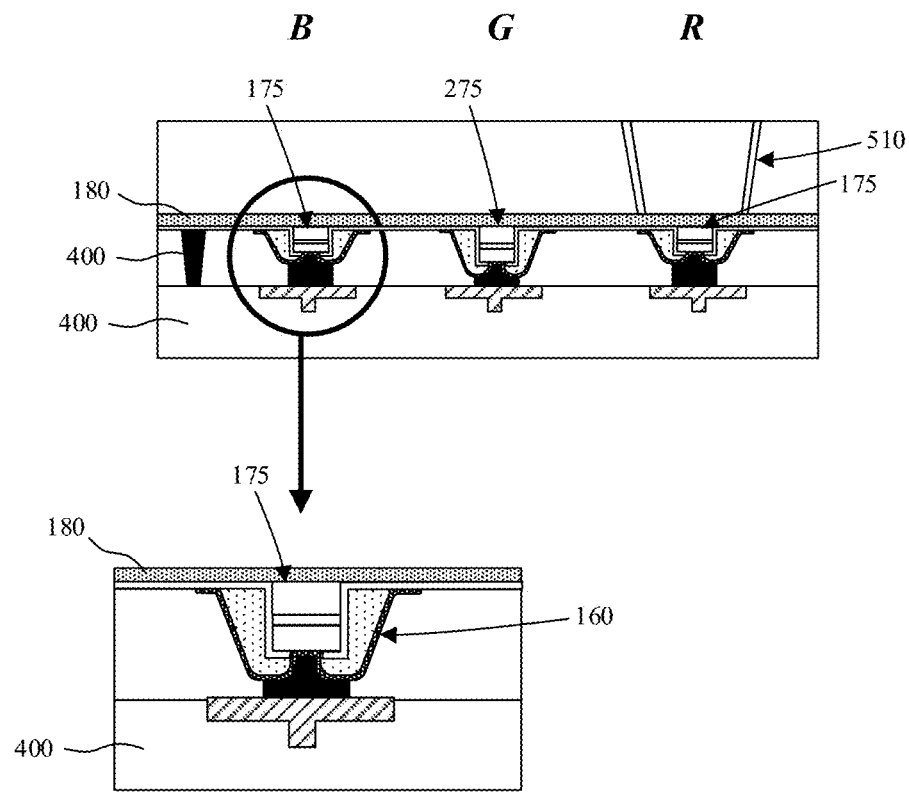
FIG. 10A is a schematic cross-sectional side view illustration of a pixel structure in accordance with an embodiment.
Figure 10B:
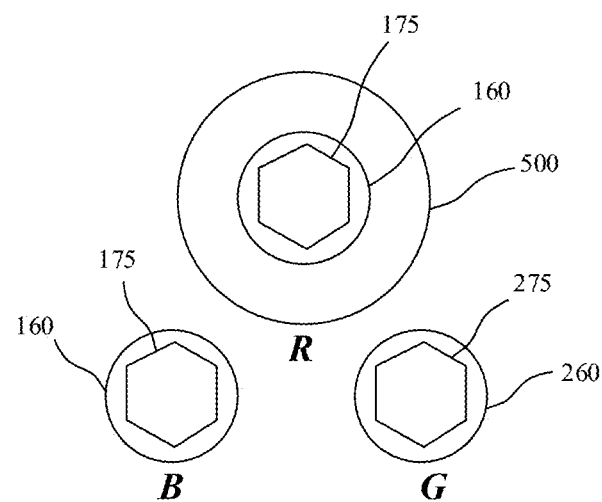
FIG. 10B is a schematic top view illustration of a pixel structure of FIG. 10A in accordance with an embodiment.

FIG. 10A is a schematic cross-sectional side view illustration of a pixel structure in accordance with an embodiment. FIG. 10B is a schematic top view illustration of a pixel structure of FIG. 10A in accordance with an embodiment. The exemplary pixel structures illustrated are red-green-blue (RGB) pixel structures, though this is understood to be exemplary, and embodiments are not so limited. In an exemplary structure an RGB pixel includes a blue emitting subpixel (B), green emitting subpixel (G), and red emitting subpixel (R). The blue and red emitting subpixels each include a blue-emitting LED 175, while the green emitting subpixel includes a green-emitting LED 275. As shown, optics 500 may be formed of the blue-emitting LED 175 within the red-emitting subpixel to convert the emitted light from blue to red. In other embodiments, the LED within the red-emitting subpixel is designed for a different color emission. Thus a blue-emitting LED is not required. However, inclusion of blue-emitting LEDs may provide design uniformity in that they are able to be processed using the same LED coupons as the blue-emitting subpixels.

Figure 11A:
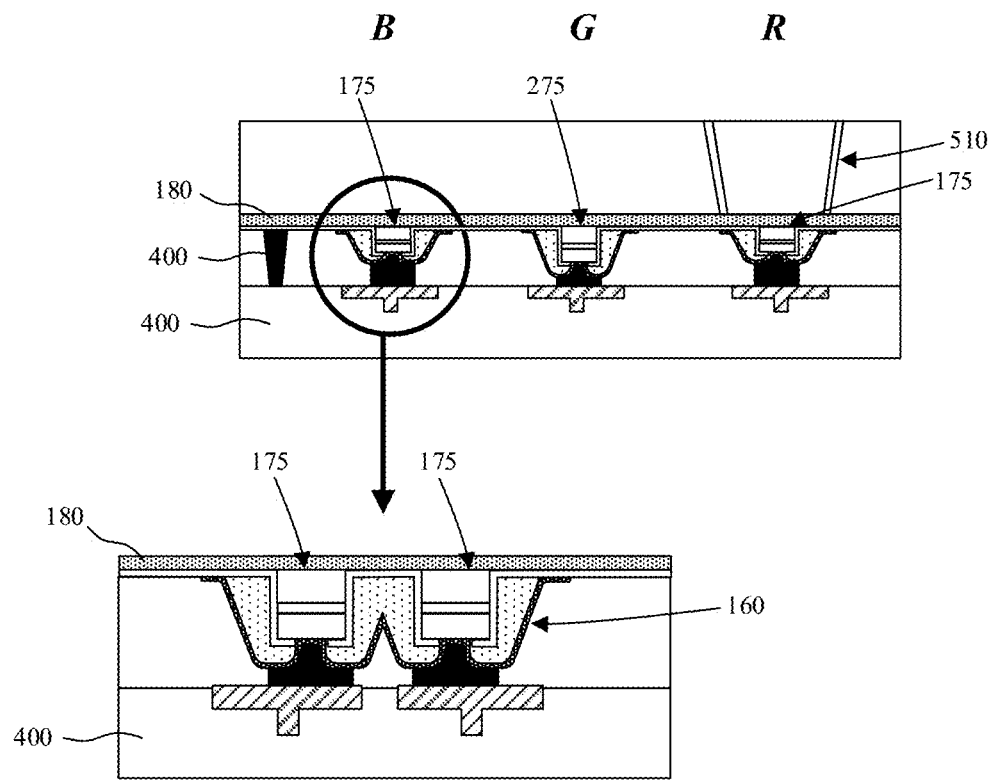
FIG. 11A is a schematic cross-sectional side view illustration of a pixel structure including redundant LEDs in accordance with an embodiment.
Figure 11B:
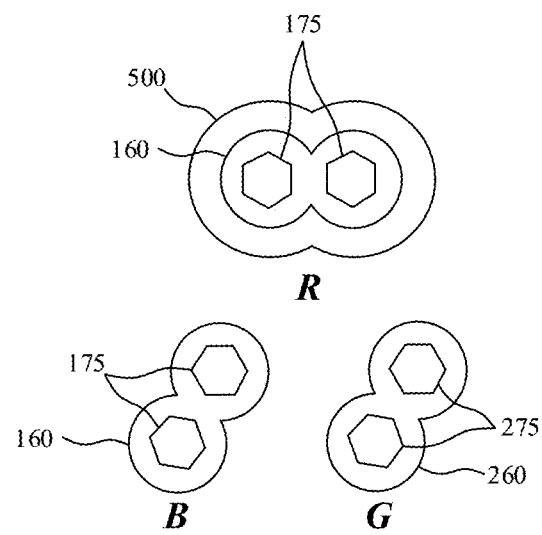
FIG. 11B is a schematic top view illustration of a pixel structure including redundant LEDs of FIG. 11A in accordance with an embodiment.

FIG. 11A is a schematic cross-sectional side view illustration of a pixel structure including redundant LEDs in accordance with an embodiment. FIG. 11B is a schematic top view illustration of a pixel structure including redundant LEDs of FIG. 11A in accordance with an embodiment. The embodiments illustrated in FIGS. 11A-11B are similar to those in FIGS. 10A-10B, with the addition of LED redundancy. In the embodiments illustrated, the redundant LED pairs may share the same well structures 160, 260. Additionally, the redundant LED pairs may share the same optics 500. In other embodiments, each LED may have its own corresponding well structure, and optional optics.

In addition to the embodiments illustrated in FIGS. 10A-11B, each LED or LED pair may have its own optics 500. Optics 500 are not limited to color conversion. For example, a separate micro-optic element 510 may be located over each LED or LED pair.

In an embodiment, a light emitting structure includes a first pair of LEDs 175 including a corresponding pair of first inorganic semiconductor-based p-n diodes 151 designed to emit a first color emission, and a corresponding pair of first metallic bottom contacts 180 bonded to a corresponding pair of separate first electrode pads 410. The light emitting structure additionally includes a second pair of LEDs 275 including a corresponding pair of second inorganic semiconductor-based p-n diodes 251 designed to emit a second color emission different from the first color emission, and a corresponding pair of second metallic bottom contacts 280 bonded to a corresponding pair of separate second electrode pads 410. In an embodiment, the pair of first metallic bottom contacts 180 is thicker than the pair of second metallic bottom contacts 280, and the pair of second inorganic semiconductor-based p-n diodes 251 is thicker than the pair of first inorganic semiconductor-based p-n diodes 151.

The bottom surfaces 182, 282 of the pairs of first and second metallic bottom contacts 180, 280 may be co-planar, with the pair of first metallic bottom contacts 180 being thicker than the pair of second metallic bottom contacts 280 by a first thickness, and the pair of second inorganic semiconductor-based p-n diodes 251 being thicker than the pair of first inorganic semiconductor-based p-n diodes 151 by approximately the same first thickness.

In an embodiment, the first pair of LEDs 175 is mounted within a first (reflective) well structure 160, and the second pair of LEDs 275 is mounted within a second (reflective) well structure 260. As shown, the second well structure 260 may be taller than the first well structure 160.

In accordance with embodiments, structures and fabrication sequences are described for highly efficient, high-brightness micro display panels based on arrays of groups of inorganic semiconductor based micro LEDs as emissive components. In accordance with embodiments, high emission efficiency may be achieved for on-axis emission and narrow angular band shaping for low power consumption, and wearable applications. In particular, the processing sequences may include on-wafer fabrication of optical components to simplify integration. Thus, individual micro LED transfer is not required.

More specifically, broad areas of LED coupons for each primary color emission may be bonded to a temporary carrier substrate, and dry etched to form pixel arrangements of micro LED mesa structures using a common mask set process for all colors. Additionally, optics such as reflective well structures may be formed around the micro LED mesa structures, as well as bottom contacts for each micro LED mesa structure. Use of the common mask sets enables maintaining required pitch and state of the art lithography tolerances across the entire wafer before subsequent bonding to a display substrate, such as a CMOS wafer. For example, this may be a twelve inch CMOS wafer. Additional optics, and optional color conversion structures may then be formed on top of some of the micro LEDs in order to achieve specific pixels (e.g. red). Again, a common mask set may enable state of the art lithography tolerances across the entire wafer to align the optics with the LED array.

The light emitting structures (e.g. display panels) in accordance with embodiments may be driven with a CMOS backplane, more specifically, using digital dimming by pulse width modulation. The panels may include pixels with (500×500 to 4,000×4,000) emissive micro LEDs. The micro LEDs can be designed to emit light in red, green, blue spectral ranges for example, though others are possible. The light emitting structure can be either monochromatic, or with combined colors.

Since embodiments facilitate the use of state of the art lithography tolerances, the micro LEDs may be smaller than possible using other integration techniques. For example, an exemplary subpixel size may be 3-10 μm, with each micro LED mesa width being 0.5-5 μm, or more specifically approximately 1-2 μm. The reduced size of the micro LEDs further facilitates the incorporation of optical elements around the micro LEDs, and optionally color conversion structures.

In some embodiments, the micro LEDs (or pairs of micro LEDs in case of redundancy) may have optical features to shape light in an on-axis direction (e.g. orthogonal to the display substrate). More specifically, the features may be configured to increase light extraction in an acceptance cone, such as +/−7 degrees. The optical features may be around and/or above the micro LEDs. For example, the optical features may include a reflective well structure. The reflectance can be accomplished by coating a metal layer (e.g. aluminum, silver, gold) on sidewalls and bottom of the well structure. Sidewalls of the reflective well structure may be tilted to re-direct light upward. The fill material surrounding the micro LED within the well structure may include a diffuser, such as high index particles dispersed in a matrix. Optics may additionally be located over the micro LEDs. For example, a color conversion structure can be included in the optics. Sidewalls of the optics may also be coated with a reflective material. A reflective surface may also be present on a part of the top surface of the micro LED in order to more efficiently shape light emission.

Simulation Example 1

Figure 12A:
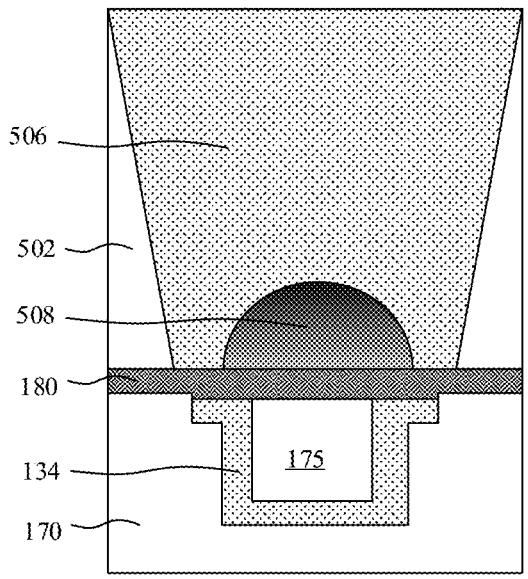
FIG. 12A is a schematic cross-sectional side view illustration of a transparent half-ball high-index lens over an LED in accordance with an embodiment.
Figure 12B:
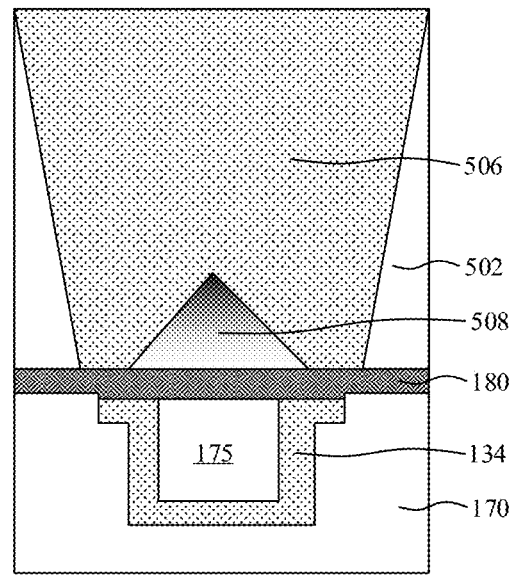
FIG. 12B is a schematic cross-sectional side view illustration of a transparent cone-shaped high-index lens over an LED in accordance with an embodiment.
Figure 12C:
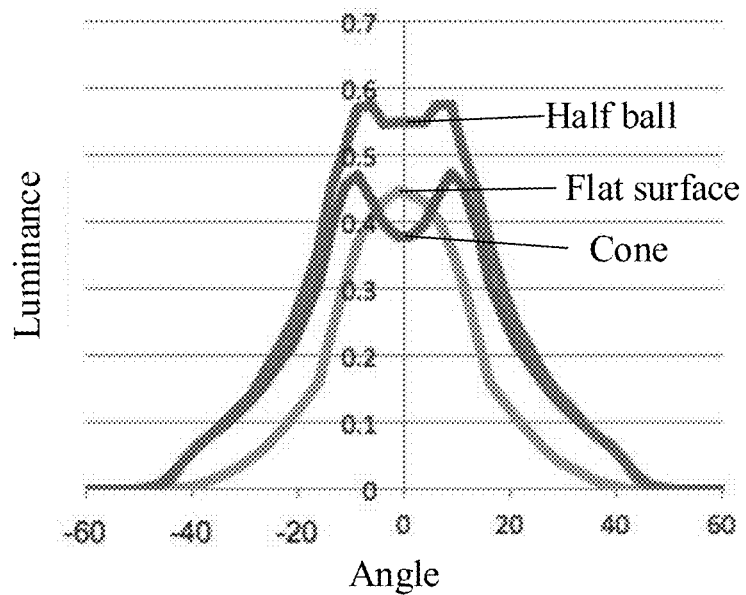
FIG. 12C is a graph of simulation data of luminance versus viewing angle in accordance with an embodiment.

Since shaping of micro-sized LEDs can be challenging, it may be more practical to place a high index structure over the LED to increase light extraction. In order to demonstrate the light extraction and collimation optics for a micro LED display panel simulation data was performed for an LED with overlying conical micro-optical element 510 (top well), a similar structure with an additional half-ball high index lens 508 placed over the LED within the conical micro-optic element 510 (top well) (FIG. 12A), and a similar structure with a conical high index lens 508 placed over the LED within a conical micro-optic element 510 (top well) (FIG. 12B). In these simulation specimens, the LED had a maximum width of 2 μm, 2 μm thickness, and vertical LED sidewalls. The transparent high-index lens 508 (e.g. half-ball, conical) had an index of refraction of (n=1.8-2.4). Bank layer 502 was formed of a lower index material (n=1.4-1.5), with optical material 506 having a refractive index (n=1.6-1.8) that is lower than that of the high index lens 508. Openings in the bank layer 502 for the optical material 506 (and optional high index lens 508) had a top width of 4-5 μm, and height of 5-10 μm. The conical high index lens 508 is inverted compared to the conical optical material 506 of the conical micro-optic element 510 in the particular embodiment illustrated in FIG. 12B. The simulation data provided in FIG. 12C of luminance over angle illustrates that the half-ball high index lens 508 was found to increase total light extraction and light on-axis, while a conical high index lens 508 can increase total light extraction, but also decrease light on-axis.

Simulation Example 2

Figure 13:
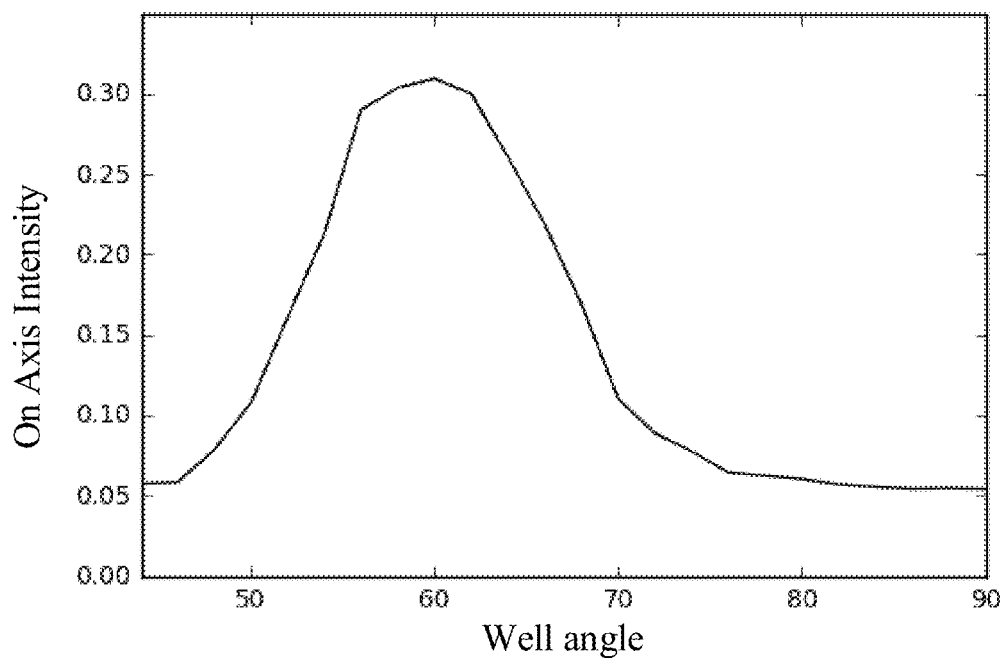
FIG. 13 is a plot of simulation data for on-axis light intensity as a function of well angle in accordance with embodiments.

In order to demonstrate the effectiveness of well structure angle to horizontal ($\alpha_w$) a simulation study was performed to measure on-axis light intensity as a function of well structure angle. The LEDs are blue-emitting in this simulation example. Specifically, each LED was a hexagon shaped LED, with maximum width of 2 μm, 2 μm thickness, and vertical LED sidewalls. The LED is mounted within a well structure of 4.5 μm diameter. Results of simulation example 2 are provided in the plot of on-axis light intensity as a function of well angle in FIG. 13. As shown well structure angle to horizontal ($\alpha_w$) was found to significantly increase with angles between 50-70 degrees, and greater than 5× increase at 60 degrees.

Simulation Example 3

Figure 14:
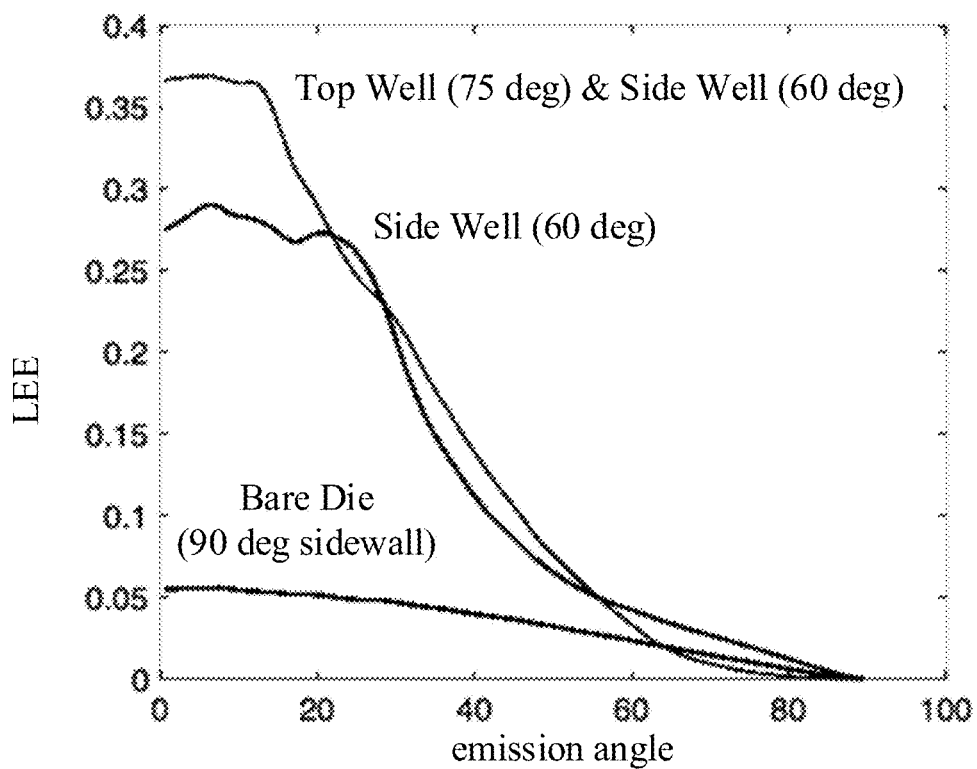
FIG. 14 is a plot of simulation data for light extraction efficiency as a function of emission angle for structures in accordance with embodiments.

Referring now to FIG. 14 a plot of simulation data is provided for light extraction efficiency (LEE) as a function of viewing angle for various structures in accordance with embodiments. Specifically, simulation data is provided for a bare LED (Bare Die), a LED mounted within a reflective well structure 160 (Side Well), and a LED with a micro-optic element 510 (Top Well) over a reflective well structure 160. The LEDs are blue-emitting in this simulation example. Specifically, the bare LED (Bare Die) was configured to have a 2 μm height, hexagonal shape with 2 μm maximum width, and vertical sidewalls. The LED mounted within a reflective well structure (Side Well) was of the same dimensions as the bare LED, mounted in a reflective well structure with well structure angle 60 degrees to horizontal ($\alpha_w$), and 2 μm height. The LED with a micro-optic element (Top Well) included an LED with 1 μm height, hexagonal shape with 1 μm maximum width, and vertical sidewalls, mounted within a reflective well structure with well structure angle 60 degrees to horizontal ($\alpha_w$), and an overlying micro-optic element with a sidewall angle 75 degrees to horizontal ($\alpha_c$). As shown on-axis LEE was significantly improved within +/−7 degrees of the on-axis angle (0 degrees). Thus, inclusion of the micro-optic element (Top Well) further increases collimation, as well as on-axis LEE in this simulation example.

Simulation Example 4

Figure 15:
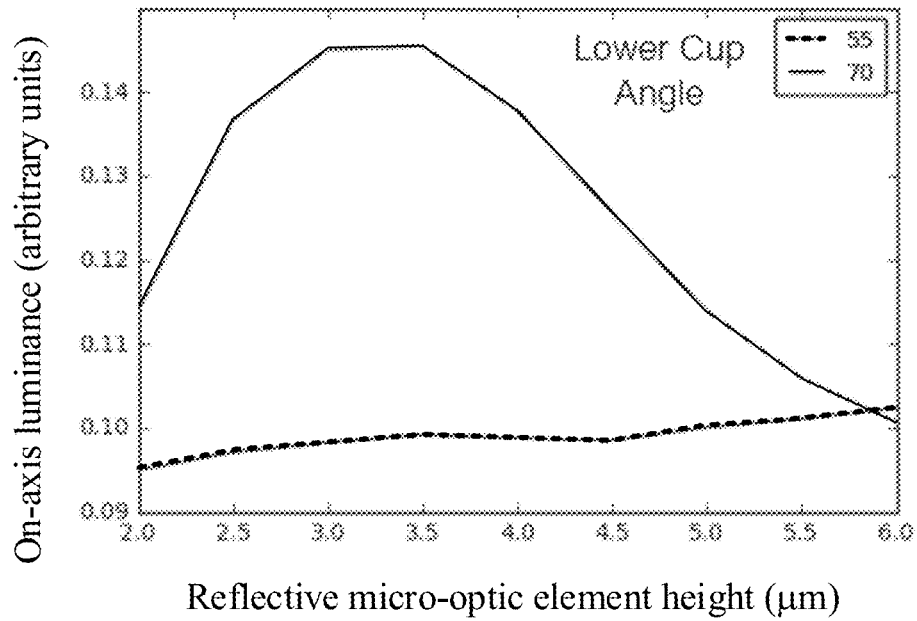
FIG. 15 is a plot of on-axis luminance versus micro-optic element height with an underlying bottom well structure accordance with an embodiment.

Light extraction and collimation optics may also be dependent upon angle of the bottom well structure 160 and the micro-optic element 510 height and angle. Referring to FIG. 15 a plot of on-axis luminance versus micro-optic element 510 height is provides for bottom well structures 160 with 55 and 70 degrees well structure angles to horizontal ($\alpha_w$). The simulation data is based on the structure of simulation example 3, in which micro-optic element 510 height is varied between 2 μm and 7 μm (with angle increasing with height). As shown, selection of appropriate bottom well structure angle to horizontal ($\alpha_w$) can have a significant impact on lowering necessary micro-optic element 510 height. Thus, with a bottom well structure 160, the micro-optic element 510 height may be shorter.

Simulation Example 5

Figure 16:
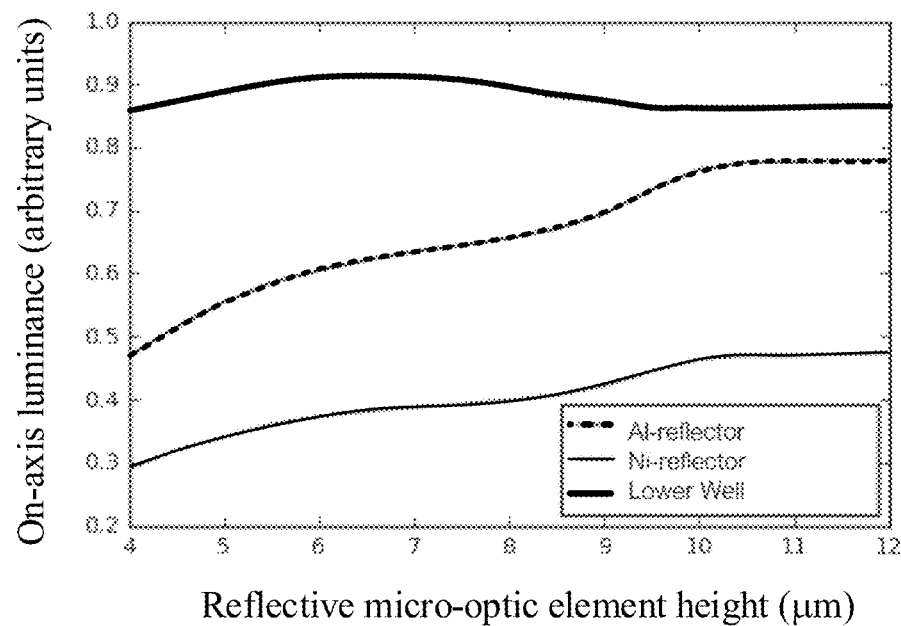
FIG. 16 is a plot of on-axis luminance versus micro-optic element height with no underlying bottom well structure in accordance with an embodiment.

Referring now to FIG. 16 simulation data is provided for on-axis luminance versus micro-optic element 510 height. The simulation specimens of example 5 include that with an LED mounted in a reflective bottom well structure, and micro-optic elements formed over an LED in which the LED had a back-side reflector made of either aluminum or nickel (e.g. p-doped layer 108 of LED is covered with a back-side reflector, electrode on bottom surface) and the LED was not mounted within a reflective bottom well structure. While the simulation specimen with only micro-optic elements with reflective sidewalls did not achieve as high on-axis luminance as a reflective bottom well structure only, on-axis luminance did increase with micro-optic element 510 height up to about 10 μm.

Simulation Example 6

Figure 17A:
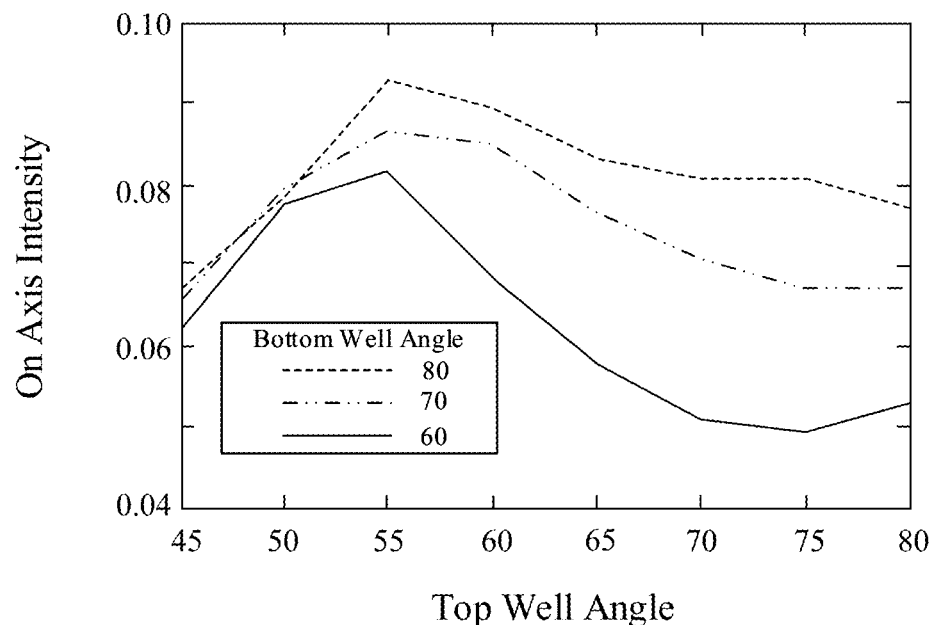
FIG. 17A is a plot of simulation data for on-axis light intensity as a function of bottom well angle and top well angle of a color converting micro-optic element in accordance with an embodiment.

The remaining simulation examples are directed to configurations in which the LED light is down-converted with optical material 506. Referring now to FIG. 17A, a plot is provided of simulation data for on-axis light intensity as a function of bottom well angle and top well angle of a color converting micro-optic element in accordance with an embodiment. More specifically, the simulation data of FIG. 17A is based on a light emitting structure similar to that provided in FIG. 8, including a blue-emitting LED, and overlying micro-optic element 510 (Top Well) with optical material 506 filled with red-emitting quantum dots (blue absorbing). Otherwise, LED and well dimensions are the same as in Simulation Example 3. As shown, on-axis light intensity was highest with micro-optic element 510 sidewall angles of 45-60 degrees to horizontal (ac), though this does change with the well structure 160 (Bottom Well) angle. For example, high on-axis light intensity is maintained when higher bottom well and top well angles are combined. Furthermore, different from Simulation Example 1, on-axis light intensity was highest with higher Bottom Well angles to horizontal between 60-80 degrees, with on-axis light intensity being higher at 80 degrees to horizontal ($\alpha_c$). It is expected the result is due to the Bottom Well not having to direct (or collimate) light upward, but instead to distribute the light within the micro-optic element (Top Well).

Simulation Example 7

Figure 17B:
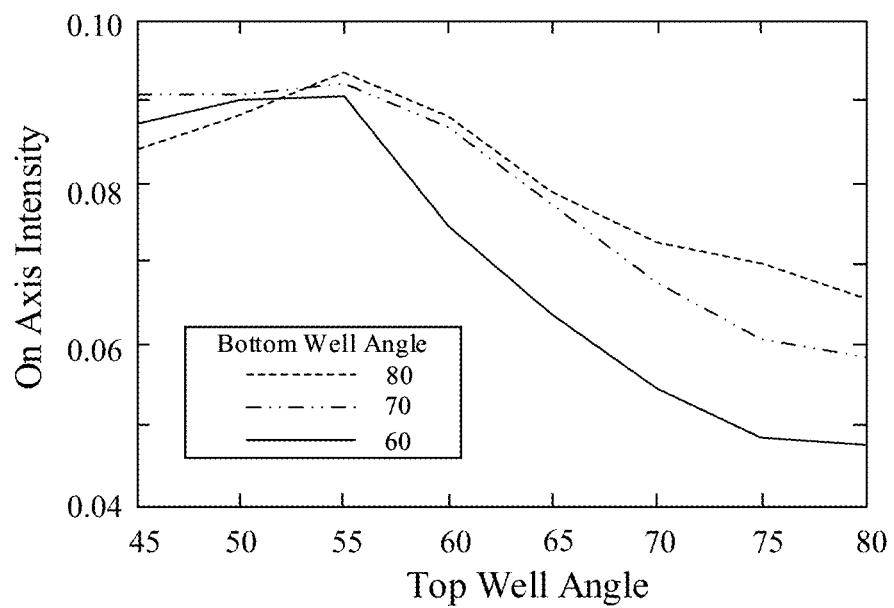
FIG. 17B is a plot of simulation data for on-axis light intensity as a function of bottom well angle and top well angle of a color converting micro-optic element with long pass DBR in accordance with an embodiment.

FIG. 17B is a plot of simulation data for on-axis light intensity as a function of bottom well angle and top well angle of a color converting micro-optic element with long pass DBR in accordance with an embodiment. The simulation data of FIG. 17B is based on a light emitting structure similar to Simulation Example 4, with the addition of a filter 520, and more specifically a long pass DBR to block all wavelengths below the red emission wavelength of the quantum dots contained within the optical layer 506. Compared to FIG. 17A, inclusion of the filter 520 demonstrates increased LEE at lower sidewall angles to horizontal ($\alpha_c$) for the micro-optic element (Top Well), and more specifically at angles of 45-60 degrees, or more particularly between 45-55 degrees.

Figure 18:
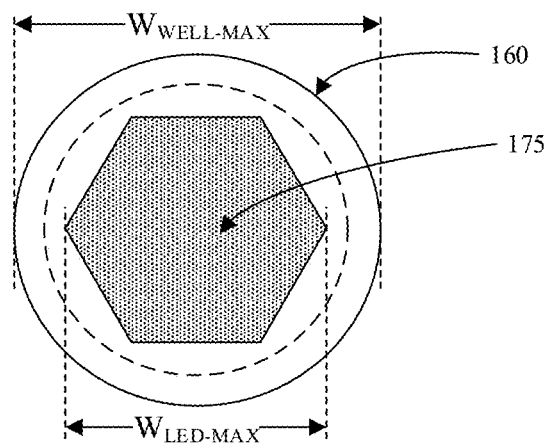
FIG. 18 is a schematic top view illustration of a micro LED in a well structure in accordance with an embodiment.
Figure 19:
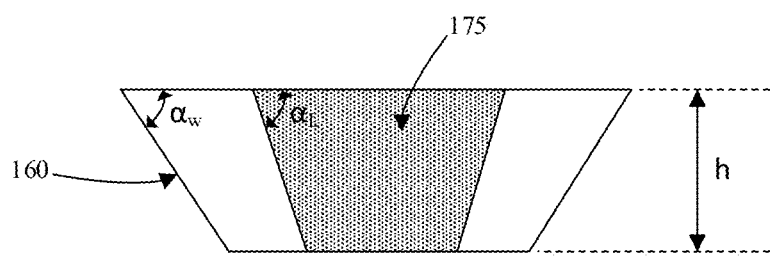
FIGS. 19-20 are schematic cross-sectional side view illustrations of a micro LED in a well structure in accordance with embodiments.
Figure 20:
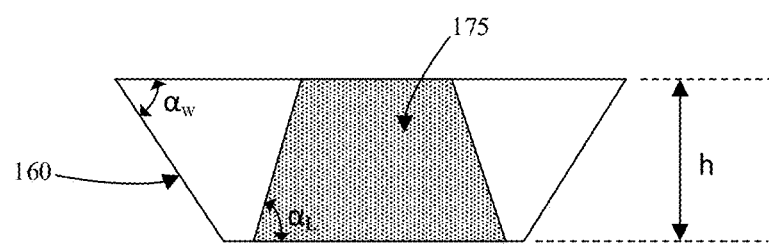

In some aspects, the processing sequences described in accordance with embodiments facilitate the formation of micro LED display structures with integrated LEDs and associated optics as significantly reduced sizes and increased densities, while also avoiding fine alignment tolerances associated with transfer. FIG. 18 is a schematic top view illustration of a micro LED in a well structure in accordance with an embodiment. FIGS. 19-20 are schematic cross-sectional side view illustrations of a micro LED in a well structure in accordance with embodiments.

In one implementation, the micro LED 175 is designed for blue or green wavelength range emission. The micro LED 175 may have a hexagonal shape, with a maximum width $W_{LED-MAX}$ of 1-5 μm, and be mounted within a well structure 160 having a maximum opening width $W_{WELL-MAX}$ of 1.5-7 μm. The micro LED 175 may have vertical sidewalls, inward sloping sidewalls (FIG. 19), or outward sloping sidewalls (FIG. 20) from bottom-to-top. In an embodiment, the LED sidewall angle to horizontal ($\alpha_L$) is 60-90 degrees, while the well structure 160 sidewall angle to horizontal ($\alpha_w$) is 60-80 degrees. In addition, total micro LED 175 height (h) may be 1-3 μm. Similarly, well structure 160 height (h) may be the same (e.g. 1-3 μm) or less. Additional optics may be located above the micro LED and well structure. For example, micro-optic element 510 may have a height of 2-5 μm when over a reflective well structure 160, and micro-optic element 510 may have a height of 5-10 μm in absence of a reflective well structure 160.

In one implementation, the micro LED 175 is designed for red wavelength range emission. The micro LED 175 may have a hexagonal shape, with a maximum width $W_{LED-MAX}$ of 1.5-4 μm, and be mounted within a well structure 160 having a maximum opening width $W_{WELL-MAX}$ of 4-5 μm. The micro LED 175 may have vertical sidewalls or outward sloping from bottom-to-top. In an embodiment, the LED sidewall angle to horizontal ($\alpha_L$) is 50-70 degrees, while the well structure 160 sidewall angle to horizontal ($\alpha_w$) is 50-80 degrees, such as approximately 60 degrees. In addition, total micro LED 175 height (h) may be 1-2 μm. Similarly, well structure 160 height (h) may be the same (e.g. 1-2 μm) or less. Additional optics may be located above the micro LED and well structure. For example, micro-optic element 510 may have a height of 2-5 μm when over a reflective well structure 160, and micro-optic element 510 may have a height of 5-10 μm in absence of a reflective well structure 160.

An exemplary LED in accordance with embodiments, may have a p-n diode with a maximum with of less than 5 microns, and maximum height of less than 3 microns. The reflective well structure 160 may include a reflective sidewall (of reflective layer 140) characterized by a sidewall angle of 55-80 degrees to horizontal ($\alpha_w$). The light emitting structure may additionally include a micro-optic element 510 with reflective sidewalls over the LED and the reflective well structure 160. In an exemplary embodiment in which the micro-optic elements 510 are designed for color conversion, the micro-optic element 510 angle to horizontal (ac) is 45-60 degrees, and the well structure 160 angle to horizontal ($\alpha_w$) is 50-80 degrees, or more specifically 60-80 degrees. In an exemplary embodiment in which the micro-optic elements 510 are designed for collimation, the angle to horizontal ($\alpha_c$) is approximately 70-85 degrees, while the well structure angle to horizontal ($\alpha_w$) is 50-80 degrees, or more specifically 55-65 degrees, such as approximately 60 degrees. In an embodiment, the micro-optic element 510 has a height of 2-5 μm when over a reflective well structure 160, and micro-optic element 510 may have a height of 5-10 μm in absence of a reflective well structure 160.

In utilizing the various aspects of the embodiments, it would become apparent to one skilled in the art that combinations or variations of the above embodiments are possible micro LED based display panel. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A light emitting structure comprising:
a substrate including a top bonding surface including a top surface dielectric bonding layer and an array of electrode pads;
an emission layer stack-up hybrid bonded to the top bonding surface of the substrate, the emission layer stack-up including:
an array of light emitting diodes (LEDs);
an array of reflective metal layers, wherein each reflective metal layer spans laterally around and underneath a corresponding LED, and each reflective metal layer is in electrical contact with a bottom surface of a corresponding LED;
a dielectric bonding layer spanning underneath the array of LEDs; and
an array of bond posts directly connected to the array of reflective metal layers and extending through the dielectric bonding layer;
wherein each bond post is metal-metal bonded with an electrode pad of the substrate, and the dielectric bonding layer is directly bonded with the top surface dielectric bonding layer of the substrate.
2. The light emitting structure of claim 1, wherein the dielectric bonding layer is an oxide bonding layer.
3. The light emitting structure of claim 2, wherein the top surface dielectric bonding layer is a top surface oxide bonding layer.
4. The light emitting structure of claim 1, wherein each LED comprises an inorganic semiconductor-based p-n diode.

5. The light emitting structure of claim 4, wherein each reflective metal layer comprises a material selected from the group consisting of aluminum, gold, and silver.

6. The light emitting structure of claim 4, wherein each reflective metal layer is a continuous layer.

7. The light emitting structure of claim 6, further comprising a plurality of sidewall passivation layers, each sidewall passivation layer between a corresponding LED and corresponding reflective metal layer.

8. The light emitting structure of claim 7, further comprising an opening in each sidewall passivation layer that exposes a bottom surface of the corresponding LED, and the corresponding reflective metal layer contacts the bottom surface of the corresponding LED in the opening.

9. The light emitting structure of claim 7, wherein each inorganic semiconductor-based p-n diode has a maximum width of less than 5 microns, and maximum height of less than 3 microns.

10. The light emitting structure of claim 4, wherein each inorganic semiconductor-based p-n diode has a maximum width of less than 5 microns, and maximum height of less than 3 microns.

11. The light emitting structure of claim 10, wherein the array of LEDs is arranged in a first group of LEDs and a second group of LEDs, wherein the array of bond posts includes a first group of bond posts electrically connected to the first group of LEDs and a second group of bond posts electrically connected to the second group of LEDs, wherein the first group of bond posts is thicker than the second group of bond posts.

12. The light emitting structure of claim 11, wherein the first group of LEDs is thinner than the second group of LEDs.

13. The light emitting structure of claim 10, further comprising an array of micro-optic elements over the array of LEDs.

14. The light emitting structure of claim 13, wherein the array of micro-optic elements includes an array of half-balls.

15. The light emitting structure of claim 13, wherein the array of micro-optic elements includes reflective sidewalls.

16. The light emitting structure of claim 1, wherein the substrate includes circuitry to address the array of LEDs.

17. The light emitting structure of claim 1, wherein the substrate includes complementary metal-oxide-semiconductor (CMOS) circuitry.

* * * * *